(12) United States Patent
Chong

(10) Patent No.: US 6,417,672 B1
(45) Date of Patent: Jul. 9, 2002

(54) DETECTION OF BRIDGE TAP USING FREQUENCY DOMAIN ANALYSIS

(75) Inventor: Raymond L. Chong, San Jose, CA (US)

(73) Assignee: Sunrise Telecom, Inc., San Jose, CA (US)

(*) Notice: Subject to any disclaimer, the term of this patent is extended or adjusted under 35 U.S.C. 154(b) by 137 days.

(21) Appl. No.: 09/636,433

(22) Filed: Aug. 11, 2000

Related U.S. Application Data

(62) Division of application No. 09/295,857, filed on Apr. 21, 1999, now Pat. No. 6,177,801.

(51) Int. Cl.[7] .......................... G01R 31/08; H04M 3/22
(52) U.S. Cl. ..................... 324/520; 324/527; 379/26.02
(58) Field of Search .................................. 324/520, 533, 324/527, 532, 534, 535, 543; 379/26.02, 22.02

(56) References Cited

U.S. PATENT DOCUMENTS

| | | | |
|---|---|---|---|
| 3,728,620 A | 4/1973 | Heins | 324/52 |
| 3,904,839 A | 9/1975 | Peoples | 179/175.3 |
| 4,095,212 A | 6/1978 | Pruitt | 340/224 |
| 4,533,201 A | 8/1985 | Wasserlein | 339/99 |
| 5,128,619 A | * 7/1992 | Bjork et al. | 324/533 |
| 5,173,896 A | 12/1992 | Dariano | 370/13 |
| 5,369,366 A | 11/1994 | Piesinger | 324/533 |
| 5,425,052 A | 6/1995 | Webster et al. | 375/224 |
| 5,461,318 A | 10/1995 | Borchert et al. | 324/533 |
| 5,517,523 A | 5/1996 | Nabors et al. | 375/228 |

OTHER PUBLICATIONS

Tektronix User Manual, TS100 TelScout, Metallic Time–Domain Reflectometer 070–8778–04, pp. 2–1, 2–5, 2–6, 3–3, 4–14 through 4–19, Glossary–1–Glossary 2.

* cited by examiner

*Primary Examiner*—N. Le
*Assistant Examiner*—Anjan K. Deb
(74) *Attorney, Agent, or Firm*—Townsend and Townsend and Crew LLP

(57) ABSTRACT

A method for detecting the presence of a bridge tap and other types of fault in a transmission line. Initially, test signals of predetermined frequencies are transmitted into a transmitting end of the transmission line. The test signals are received at a receiving end of the transmission line and the amplitudes of the received signal are measured. A frequency response of the transmission line is computed based on the measured amplitudes. The frequency response is then analyzed for the presence of a frequency-domain signature that corresponds to one of the detectable types of fault. The presence of a bridge tap or another type of fault is identified based on the detected frequency-domain signature. The frequency-domain signature associated with a bridge tap can comprise a set of one or more attenuation dips in the frequency response, with each attenuation dip corresponding to a local minima in the frequency response. The length of the bridge tap can be estimated based on a fundamental frequency of the set of harmonically related attenuation dips. Also, the location of the bridge tap in the transmission line can be estimated by performing a time domain reflectometer (TDR) test.

8 Claims, 19 Drawing Sheets

MASTER UNIT    SLAVE UNIT

810

```
 123456789012345678901234567890122
1                           12:30:55  1
2                                     2
3          LINE MEASUREMENT           3
4          MODE: [MASTER]             4
5                                     5
6          RESULT TYPE:               6
7                                     7
8          INSERTION LOSS             8
9          SIGNAL TO NOISE            9
0          BACKGROUND NOISE           0
1          LOOP RESISTANCE            1
2                                     2
3                                     3
4                                     4
5                                     5
6   MASTER   SLAVE                    6
 123456789012345678901234567890122
```

```
 123456789012345678901234567890122
1                           12:30:55  1
2 >                          Idle <   2
3          INSERTION LOSS             3
4                                     4
5          [ADSL DMT 256]             5
6          HDSL T1 196 kHz            6
7          HDSL T1 392 kHz            7
8          HDSL E1 260 kHz            8
9          ISDN U 40 kHz              9
0          ISDN S 96 kHz              0
1          DDS 82 kHz                 1
2          T1 772 kHz                 2
3          E1 1.024 MHz               3
4                                     4
5                                     5
6                    START            6
 123456789012345678901234567890122
```

```
 123456789012345678901234567890123456789012
1                                   12:30:55
2 >Complete                        Connected<
3      RESULTS - SIGNAL TO NOISE
4
5      FREQUENCY: 196 kHz
6      SIG/NOISE:  37 dB
7
...
6                                      RESTART
```

```
 123456789012345678901234567890123456789012
1                                   12:30:55
2 >Complete                        Connected<
3        DMT BACKGROUND NOISE
4 Tone 192: 772 kHz : -102 dBm/Hz
5 Tone 193: 776 kHz : -105 dBm/Hz
6  -70
7  -80 ─872
8  -90       876
9 -dB
0
1 -120
2 -130    874
3 -140 ─────────────────────── 256
4        1      TONE #
5
6   ◄◄    ►►    TABLE   RESTART
```

880 points to rows 2
882 points to rows 4, 5

FIG. 8F

DETECTION OF BRIDGE TAP USING FREQUENCY DOMAIN ANALYSIS

CROSS-REFERENCE TO RELATED APPLICATION

This application is a divisional of U.S. patent application Ser. No. 09/295,857 filed Apr. 21, 1999, now U.S. Pat. No. 6,177,801 entitled "Detection of Bridge Tap Using Frequency Domain Analysis," which is hereby incorporated herein by reference in its entirety.

BACKGROUND OF THE INVENTION

This invention relates generally to test instrumentation, and in particular to techniques for detecting bridge tap and other types of fault in a transmission line using frequency domain analysis.

Transmission lines are ubiquitous, and are use for transmission of communications and other electromagnetic signals. Examples of transmission lines include telephone wires, power lines, coaxial cables, twisted wire pair, and others. Typically, before a transmission line is activated for use, testing is performed to qualify the line. Such testing often includes the detection of faults (or events) corresponding to discontinuities in the impedance of the transmission line.

A common type of fault in a transmission line is a bridge tap. A bridge tap is a popular mechanism for attaching additional circuits to a transmission line, and comprises an additional line (also referred to as a lateral) coupled or spliced to the main line. The presence of the bridge tap affects the characteristic impedance of the transmission line to which it couples. The change in the line impedance due to the bridge tap is dependent on many factors, such as the length of the bridge tap, the circuitry coupled to the bridge tap (i.e., the loading), the characteristic impedance of the bridge tap, and other factors.

A transmission test set can be used to detect faults in a transmission line. More specifically, a time domain reflectometer (TDR) is conventionally used to detect discontinuities in the line impedance by transmitting pulses of energy, measuring the reflected pulses (if any), and determining the type and location of the fault(s) by analyzing the time-domain "signature" of the reflected pulses. The reflections are caused by both expected faults (e.g., gauge changes, splices) and unexpected faults (e.g., shorts, opens, water) in the transmission line.

The magnitude and phase of the reflected pulses are determined by the characteristics of the particular faults along the transmission line. For example, if the fault is an open circuit, the reflected pulse is in-phase with the transmitted pulse (i.e., both pulses have the same polarity). Alternatively, if the fault is a short circuit, the reflected pulse is out-of-phase with the transmitted pulse (i.e., the pulses have opposite polarities). Thus, by analyzing the magnitude and phase of the reflected pulses, an estimate can be made as to the identity and location of the faults in the transmission line.

The testing of a transmission line for faults is made challenging by a number of additional factors. For example, a transmitted signal in a transmission line naturally exhibits attenuation (or loss) due to the resistive, inductive, and capacitive characteristics of the transmission line. This natural attenuation degrades and distorts the transmitted and reflected signals, thus making it more difficult to accurately identify faults. The transmission line loss, particularly for a twisted wire pair, is also worse at higher frequencies, which tends to mask details in the reflected pulses.

From the above, techniques that can accurately detect the presence of faults, such as a bridge tap, in a transmission line is needed in the art.

SUMMARY OF THE INVENTION

The present invention provides techniques for detecting the presence of faults, including bridge tap, in a transmission line using frequency domain analysis. Initially, a frequency response is obtained for the transmission line under test. The frequency response is then analyzed for the presence of frequency-domain "signatures" that are indicative of specific types of fault. For example, a frequency-domain signature comprising a set of harmonically related attenuation dips is indicative of the presence of a bridge tap in a transmission line. Each attenuation dip corresponds to a local minima in the frequency response. Other frequency-domain signatures can be associated with other types of fault.

An embodiment of the invention provides a method for detecting the presence of bridge tap and other types of fault in a transmission line. In accordance with the method, test signals of predetermined frequencies are transmitted into a transmitting end of the transmission line. The test signals are received at a receiving end of the transmission line and the amplitudes of the received signals are measured. In an embodiment, the transmitting and receiving ends are opposite ends of the transmission line. A frequency response of the transmission line is computed based on the measured amplitudes. The frequency response is then analyzed for the presence of a frequency-domain signature that corresponds to one of the detectable types of fault. The presence of a bridge tap or another type of fault is identified based on the identified frequency-domain signature. The frequency-domain signature associated with a bridge tap can comprise a set of one or more (i.e., harmonically related) attenuation dips in the frequency response, with each attenuation dip corresponding to a local minima in the frequency response.

The length of the bridge tap can be estimated based on the frequency of the first attenuation dip in the set of attenuation dips. Also, the location of the bridge tap in the transmission line can be estimated by performing a time domain reflectometer (TDR) test.

The invention also provides a computer program product that implements the method described above.

Another embodiment of the invention provides a test set for detecting the presence of bridge tap and other types of fault in a transmission line. The test set includes at least one signal input port, test circuitry, a processor, and a display. The test circuitry couples to the at least one signal input port and is configured to receive signals from the signal input port and generate data indicative of the amplitudes of the received signals. The processor couples to the test circuitry and is configured to receive the data indicative of the amplitudes of the received signals and generate a frequency response. The display operatively couples to the processor and is configured to receive and display the frequency response (i.e., in tabular or graphical form). The frequency response is analyzed for the presence of a frequency-domain signature that identifies the presence of a bridge tap or another type of fault in the transmission line. Again, the frequency-domain signature associated with a bridge tap can comprise a set of one or more (i.e., harmonically related) attenuation dips in the frequency response. The test set can further include a user-input device that couples to the processor and is configured to receive a signal indicating the frequency of an attenuation dip in the frequency response. The processor is then further configured to compute the length of the bridge tap based on the indicated frequency of the attenuation dip.

The foregoing, together with other aspects of this invention, will become more apparent when referring to the following specification, claims, and accompanying drawings.

BRIEF DESCRIPTION OF THE DRAWINGS

FIG. 8A shows an embodiment of a menu for transmission line impairment testing;

FIG. 8B shows a menu that lists sets of test frequencies for insertion loss measurement;

FIG. 8E shows an alphanumeric display of a signal-to-noise test result;

FIG. 8F shows a graphical display of background noise test results;

DESCRIPTION OF THE SPECIFIC EMBODIMENTS

Detection and Measurement of Bridge Taps

Conventionally, detection of bridge tap in a transmission line is performed using TDR testing, which identifies discontinuities in the impedance of the transmission line. Specifically, the TDR test detects reflected pulses and the distortions of these reflected pulses due to faults in the transmission line. The faults correspond to changes in the impedance of the transmission line. The magnitude of the reflected pulse generally relates to the degree of impedance mismatch and the phase of the reflected pulse generally relates to the type of impedance mismatch. For example, if the fault has an impedance greater than the characteristic impedance of the transmission line, the reflected pulse would have a polarity similar to that of the transmitted pulse. Alternatively, if the fault has an impedance less than the characteristic impedance of the transmission line, the reflected pulse would have a polarity opposite from that of the transmitted pulse. The magnitude of the reflected pulse is dependent on the degree of mismatch, with a larger reflected pulse amplitude corresponding to a larger degree of mismatch (i.e., open or short) and a smaller reflected pulse amplitude corresponding to a smaller degree of mismatch (i.e., a fault having an impedance closer to the characteristics impedance of the transmission line).

Oftentimes, the detection of bridge tap using time-domain analysis (such as TDR test) is inaccurate because of imperfections in the transmission line. For example, the amplitude of the reflected pulse could be attenuated due to loss in the transmission line and the bridge tap, and not necessarily due to the impedance mismatch. Thus, a time-domain "signature" based on the reflected pulse is not an accurate diagnostic tool in many instances.

In accordance with an aspect of the invention, detection of bridge tap in a transmission line is performed using frequency domain analysis.

Figure 1A:
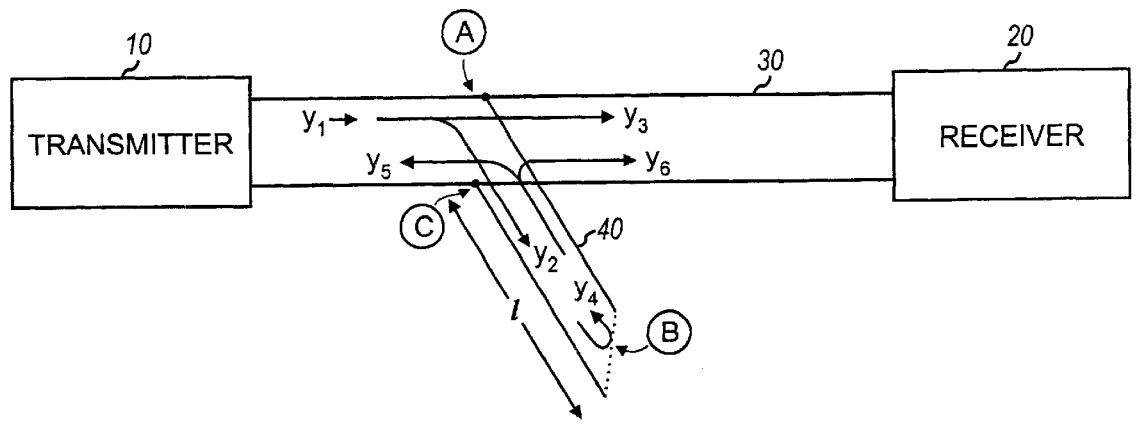
FIG. 1A shows diagram of a test setup for identifying the presence of a bridge tap in a transmission line.

FIG. 1A shows a diagram of a test setup for identifying the presence of a bridge tap in a transmission line. In FIG. 1A, a transmitter 10 transmits a test signal to a receiver 20 through a transmission line 30 under test. Transmission line 30 includes a bridge tap 40 having a length of l coupled to the transmission line at location A.

As shown in FIG. 1A, transmitter 10 transmits the test signal $y_1$ into a transmitting end of the transmission line. When the test signal reaches location A, a portion of the test signal (i.e., the coupled signal $y_2$) is coupled to and directed along bridge tap 40. The remaining portion of the incident test signal (i.e., the transmitted signal $y_3$) is directed along transmission line 30 toward receiver 20. The coupled signal $y_2$ travels toward the far end of bridge tap 40 and reflects back due to impedance mismatch at the far end. For example, if bridge tap 40 is terminated as an ideal open or short, 100 percent of the signal incident on the far end of the bridge tap is reflected back. The actual amount of reflection is dependent on the actual termination, and is typically less than 100 percent. The polarity of the reflected signal is dependent on the type of bridge tap termination (i.e., open or short). The reflected signal $y_4$ reaches point C and adds constructively or destructively with the test signal. A portion of the reflected signal ($y_5$) is directed to transmitter 10 and the remaining portion of the reflected signal ($y_6$) is directed to receiver 20. It should be noted that points A and C are at the same physical location but separated by time.

The signal received at receiver 20 is the sum of the transmitted signal $y_3$ from transmitter 10 and the reflected signal $y_6$ from bridge tap 40. Again, these signals can add constructively or destructively depending on the phases of the two signals. The phase of the signal $y_6$ from bridge tap 40 is dependent on the length and termination characteristics of the bridge tap. The bridge tap is typically terminated as an open circuit.

In FIG. 1A, transmitter 10 is located at one end of transmission line 30 and receiver 20 is located at an opposite end of transmission line 30. This test configuration results in improved measurement accuracy for the frequency response of the transmission line. In an alternative embodiment, receiver 30 can be located at the same end as transmitter 10, and is configured to measure the reflected signals from the transmission line and the bridge tap.

Figure 1B:
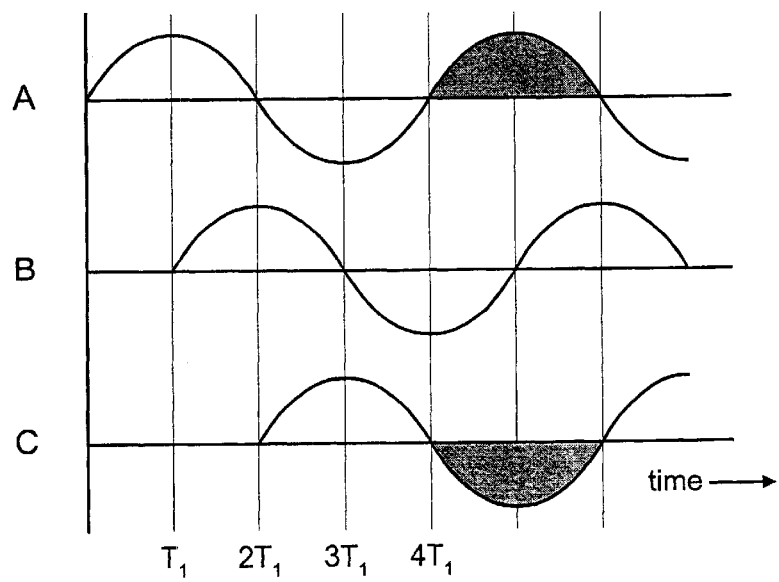
FIG. 1B shows a diagram of the test signals at various locations along the bridge tap.

FIG. 1B shows a diagram of the test signals at various locations along bridge tap 40. In this diagram, the test signal has a wavelength ($\lambda$) that is four times the length of the bridge tap (l). As can be seen, the signal at location B is delayed by a time period ($T_1$) relative to the signal at location A. In this diagram, $T_1$ is defined as the time it takes the test signal to travel the length (l) of the bridge tap, and can be computed as:

$$T_1 = \frac{l}{V_{BT}},$$

where $V_{BT}$ is the speed of the test signal in the bridge tap and is defined below.

The test signal at location B can also be viewed as being shifted by a quarter wavelength ($\lambda/4$) relative to the signal at location A. Similarly, the signal at location C is shifted by another time period ($T_1$) or by another quarter wavelength ($\lambda/4$) relative to the signal at location B, or $2T_1$ or $\lambda/2$ relative to the signal at location A. Thus, when the wavelength of the test signal is four times the length of the bridge tap, the reflected signal at location C is out-of-phase with the transmitted signal $y_3$ and some amounts of cancellation of the test signal occur at location A. The received signal at receiver 20 is then attenuated accordingly.

The amount of attenuation in the amplitude of the received signal at receiver 20 is dependent on a number of factors. For example, total attenuation occurs when the transmitted signal $y_3$ from the transmitter is completely canceled by the reflected signal $y_6$ from the bridge tap (i.e., the two signals have equal amplitude but opposite phases, or $y_3 = -y_6$). Typically, complete cancellation is not achieved since the magnitude of the cancellation is dependent on a number of factors, such as the characteristic impedance of the bridge tap, the termination of the bridge tap, and other factors. However, for a bridge tap terminated with an open circuit, at $l = \lambda/4$, some amounts of cancellation occur and the magnitude of the attenuation can usually be identified as being caused by the presence of a bridge tap in the transmission line.

Figure 1C:
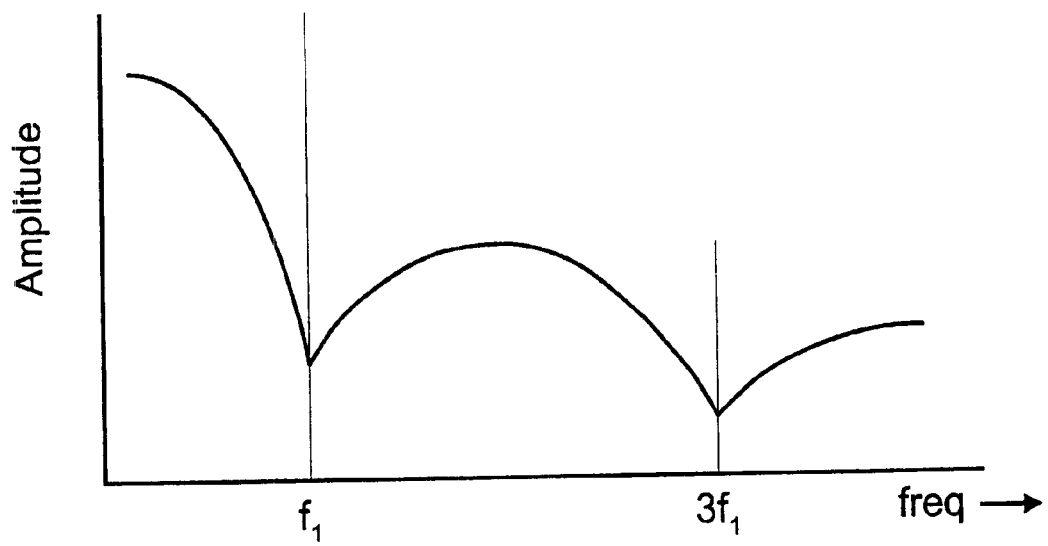
FIG. 1C shows a frequency response plot of a transmission line having a bridge tap.

FIG. 1C shows a frequency response plot of a transmission line having a bridge tap. This frequency response can be obtained by sending from transmitter 10 a test signal at a particular frequency, detecting the signal at receiver 20, and measuring the magnitude of the received signal. The measured signal is used to determine the insertion loss of the transmission line at the particular frequency. Transmitter 10 is swept such that test signals at various frequencies are transmitted, and receiver 20 is configured to detect and measure these test signals. Typically, transmitter 10 and receiver 20 are calibrated prior to the measurement such that receiver 20 indicates zero dB of insertion loss for a lossless transmission line. Insertion loss measurement is known in the art and not described in detail herein.

At a frequency $f_1$ (corresponding to a wavelength $\lambda_1$ that is four times the length of the bridge tap, or $\lambda_1/4=l$), the received signal at receiver 20 is attenuated by a maximum amount (relatively) due to cancellation of the transmitted signal $y_3$ by the reflected signal $y_6$. This cancellation is identified by an "attenuation dip" in the frequency response plot at $f_1$. The attenuation dip is a local minima in the frequency response. At a frequency three times $f_1$, the reflected signal $y_6$ is again out-of-phase with respect to the transmitted signal $y_3$, resulting in another attenuation dip in the frequency response.

The cancellation of the transmitted signal $y_3$ by the reflected signal $y_6$ can be used to detect the presence of a bridge tap in the transmission line. Referring back to FIG. 1A, transmitter 10 can be configured to sweep the frequency of the test signal and receiver 20 can be configured to detect and measure the received signal. The magnitude of the received signal is plotted against frequency and displayed (i.e., in tabular form or as a plot as shown in FIG. 1C).

In an embodiment, the presence of a bridge tap is detected based on a frequency-domain "signature" in the frequency response. Referring to FIG. 1C, this frequency-domain signature resembles a "scalloped and attenuated" response that includes a set of odd harmonically related attenuation dips. Transmission lines typically exhibit higher loss at higher frequencies due to parasitic capacitance on the line. Without the bridge tap, the insertion loss of a typical transmission line versus frequency can be approximated (to a first order) with a downward sloping straight line. The presence of the bridge tap alters the insertion loss characteristic of the transmission line. The attenuation dips can be as much as 5 to 10 dB, although the actual magnitude is dependent on a number of factors. In many instances, this frequency-domain signature is more accurate indication of the presence of a bridge tap than the time-domain signature (i.e., with its dips or bumps) obtained from the TDR test.

The frequency ($f_1$) of the first or fundamental attenuation dip can also be used to determine the length of the bridge tap. For a vacuum, the frequency and wavelength of a signal are related according to the following equation:

$$c = f \cdot \lambda, \qquad \text{Eq. (1)}$$

where c is the speed of light in a vacuum ($c = 3 \times 10^8$ meter/sec), f is the frequency of the signal, and $\lambda$ is the wavelength of the signal. Generally, the speed of light is reduced in a transmission line, and equation (1) can be rewritten as:

$$v_P \cdot c = f \cdot \lambda, \qquad \text{Eq. (2)}$$

where $v_P$ is the velocity of propagation in a transmission line, which relates to the speed of the electrons in the transmission line. Generally, $v_P$ is dependent on a number of factors, such as the material used to construct the transmission line, the temperature, and others. For example, $v_P$ typically decreases for high temperature. The scaling factor $v_P$ typically ranges from 0.4 to 0.8.

In some instances, $v_P$ is provided by the manufacturer of the transmission line, and can be empirically determined in a manner known in the art. One such method comprises sending a test signal through a transmission line of a known length, measuring the transmission time, and determining $v_P$ using the following equation:

$$v_p = \frac{l_T}{t_p \cdot c}, \qquad \text{Eq. (3)}$$

where $l_T$ is the length of the transmission line and $t_P$ is the transmission time. If the actual or empirical value of $v_P$ is not known, a default value can be used. The default value can be selected based on the approximated characteristics of the transmission line under test. For example, a default value of $v_P=0.64$ can be used for twisted wire pair commonly used for telephony.

As shown in FIG. 1C, the first attenuation dip occurs at the frequency $f_1$. For an open-circuited bridge tap, the length of the bridge tap is approximately a quarter wavelength, or $l \cong \lambda_1/4$. Thus, the length of the bridge tap can be computed as:

$$l \cong \frac{\lambda_1}{4} = \frac{v_p \cdot c}{4 f_1} \qquad \text{Eq. (4)}$$

The length of the bridge tap can thus be determined by identifying the frequency of the attenuation dip, determining the velocity of propagation $v_P$ for the transmission line (or using a default value for $v_P$ if the actual $v_P$ is not known), and computing the bridge tap length in accordance with equation (4).

The frequency response plot can be used to accurately determine the existence of one or more bridge taps. Generally, each bridge tap is identified by a frequency-domain signature that includes an attenuation dip at a fundamental frequency (f) and attenuation dips at odd harmonically related frequencies (i.e., 3f, 5f, and so on). The fundamental frequency (f) relates to the length of the bridge tap. The presence of multiple bridge taps in the transmission line can be identified by recognizing the presence of multiple sets of harmonically related attenuation dips (or multiple frequency-domain signatures) in the frequency response.

The foregoing description generally pertains to a bridge tap terminated with an open circuit. Specifically, for an open circuit termination, the attenuation dip occurs at $l \cong \lambda/4$. However, if the bridge tap is terminated with a short circuit, the attenuation dips would occur at $l \cong \lambda/2$, $l \cong 3\lambda/2$, and so on. The frequency-domain signature for a short circuit termination would have a similar shape as for an open termination (i.e., a set of harmonically related attenuation dips), but the attenuation dips would occur at different frequencies.

Once the presence of a bridge tap in the transmission line is identified, the location of the bridge tap can be determined using other known measurement techniques. In an embodiment, the location of the bridge tap is determined using a TDR test that is known in the art. Each identified bridge tap (i.e., using frequency-domain analysis) is associated with a bump or dip in the time-domain response from the TDR test. The location of the bump or dip can be computed to determine the location of the bridge tap in the transmission line.

One or more transmission test sets can be used to perform the frequency-domain analysis for the detection of bridge tap and the TDR test for the determination of the location of the bridge tap. Typically, one test set is used as the transmitter and another test set is used as the receiver. Alternatively, one test set can be used as both the transmitter and receiver. The transmitter includes circuitry capable of sending test signals at various frequencies and the receiver includes circuitry capable of receiving the transmitted test signals. The receiver also includes circuitry capable of detecting and determining the magnitude of the received signals. The receiver further includes facilities to process the detected magnitude and to display the processed magnitude (i.e., as a frequency response plot such as shown in FIG. 1C). The user can then view the frequency response, identify a frequency-domain signature corresponding to a bridge tap, and determine the existence of a bridge tap. The receiver can further include facilities to compute the bridge tap length based on the frequency of the attenuation dip. The facilities to process the detected magnitude, display the frequency response and test results, and compute the bridge tap length can be implemented using hardware, software codes executed on a processor, or a combination of both. The receiver can also be configured to allow entry of various parameters, such as the velocity of propagation $v_P$, the range of frequency sweep, and others.

In a specific implementation, the display of the receiver includes a cursor. The user is able to move the cursor to the location of the attenuation dip (i.e., at $f_1$ in FIG. 1C) and to select a key to initiate the computation of the bridge tap length. The receiver then computes the bridge tap length based on the frequency at the cursor location and displays the computed value. In this implementation, the bridge tap length is computed when invoked by the user. In another implementation, the bridge tap length is computed and displayed when the receiver is in the bridge tap identification mode; and the bridge tap length can be recomputed and updated as the cursor is moved.

The detection and measurement of bridge tap in accordance with the invention can be performed by various types of test equipment. For example, the frequency response of the transmission line can be determined by any test equipment capable of performing an insertion loss measurement, such as a transmission test set, a network analyzer, and others. The TDR test to determine the location of the bridge tap can also be performed by various types of test equipment. In an embodiment, a transmission test set is used to perform both the insertion loss measurement and the TDR test. An example of a transmission test set capable of performing these tests is described U.S. patent application Ser. No. 09/215,421, filed Dec. 18, 1998, assigned to the assignee of the present invention, and incorporated herein by reference. That transmission test set is also described below For clarity, the frequency domain analysis is described for the detection of bridge tap in a transmission line. However, the frequency-domain analysis of the invention can be used for the detection of other types of fault, including short, open, water, gauge changes, splices, and others. Each type of fault can be associated with a particular frequency-domain signature. For example, the frequency-domain signature for a bridge tap has a shape similar to that shown in FIG. 1C. The frequency response of the transmission line can be analyzed for the presence of each defined and identifiable frequency-domain signature. The frequency-domain analysis of the invention can also be used in conjunction with other tests (such as the TDR test) to further identify and quantify the detected faults.

Network Configuration

Figure 2A:
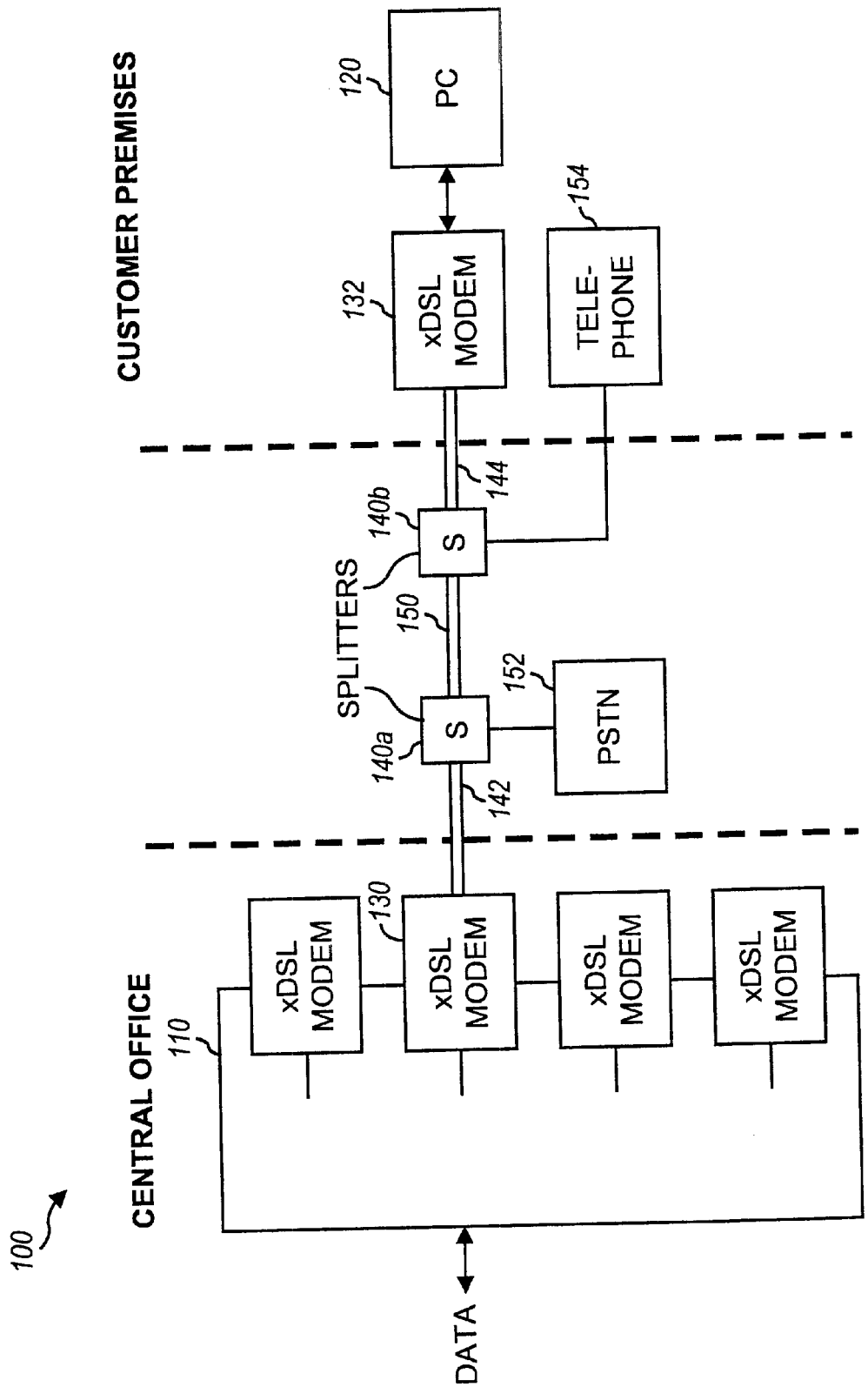
FIG. 2A shows a simplified block diagram of a digital communications network.

FIG. 2A shows a simplified block diagram of a specific embodiment of a digital communications network 100. Network 100 includes a central office 110 operatively coupled to a personal computer (PC) 120 through xDSL modems 130 and 132. xDSL modem 130 couples to central office 110 and to a splitter 140a through a channel 142. xDSL modem 132 couples to PC 120 and to another splitter 140b through a channel 144. Splitters 140a and 140b are coupled through a local loop 150 composed of one or more wire pairs, or other transmission media. Splitters 140a and 140b also couple to a public switched telephone network (PSTN) 152 and to a telephone 154, respectively, for providing a plain old telephone service (POTS). At the transmitting side, splitter 140 combines the POTS and data service into a signal suitable for transmission over local loop 150. At the receiving side, the other splitter 140 separates the received signal into the (lower frequency) voice telephone service and the (higher frequency) data service. In this manner, both voice and data can be transmitted over the same local loop concurrently without any modification to that loop.

The test set of the invention can be used to test a wide variety of communications networks, including network 100. As used herein, "communications network" generically (and broadly) refers to any structure that supports a digital service carrier using any transmission technology. The transmission technologies covered by the test set of the invention includes plain old telephone system (POTS) modem, E1, T1, Integrated Services Digital Network (ISDN), Digital Subscriber Line (DSL), High data rate DSL (HDSL), Asynchronous DSL (ADSL), Very-high data rate DSL (VDSL), Rate Adaptive DSL (RADSL), Single line DSL (SDSL), and other variants of DSL. DSL and variants of DSL are collectively referred to as xDSL. The test set of the invention can also be adopted to cover transmission technologies such as hybrid fiber coax (HFC), coaxial cable, optical fiber, and others. In a specific application, the test set of the invention is especially suited for testing communications networks implemented using one or more twisted wire pairs.

Test Set

Figure 2B:
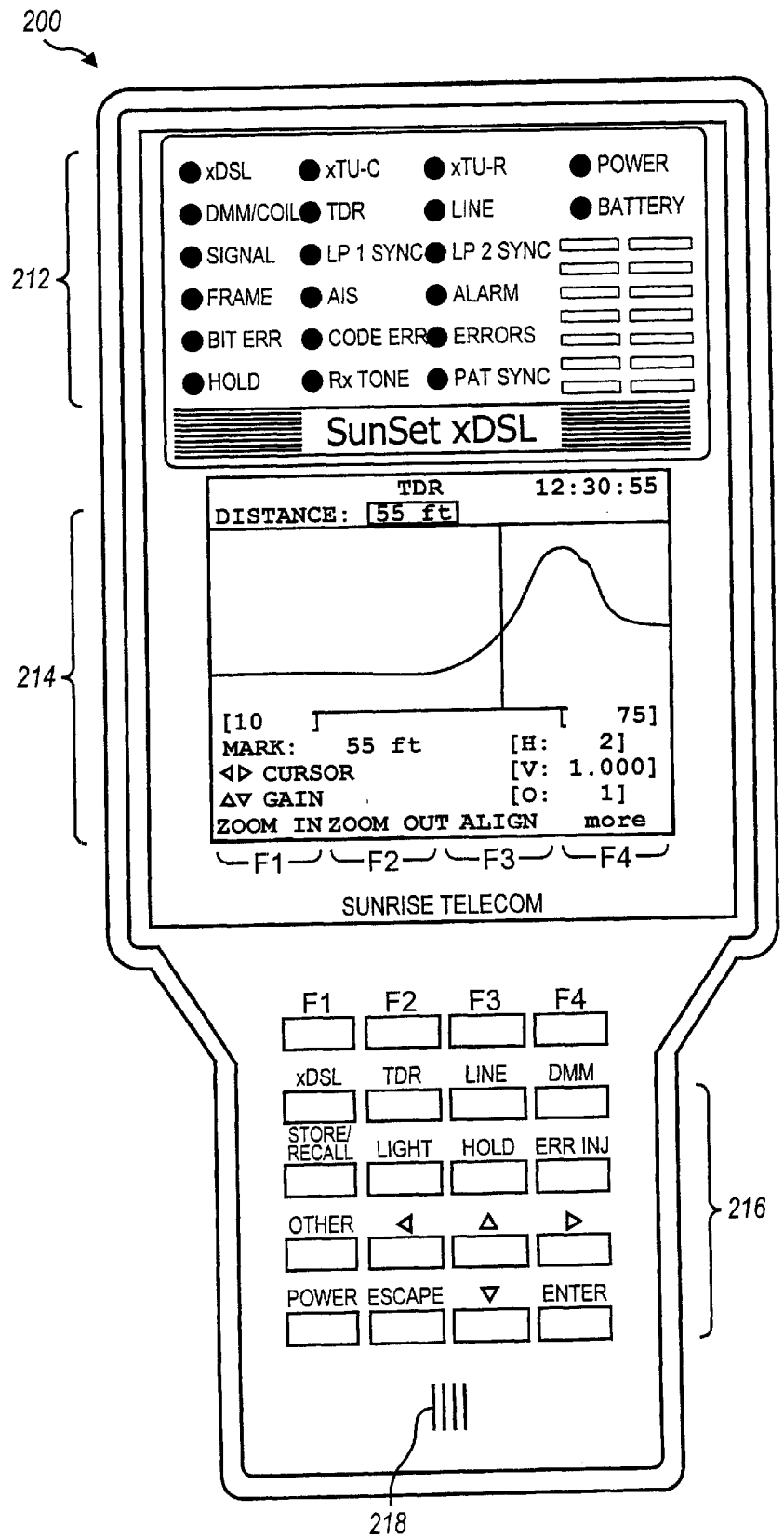
FIG. 2B shows an embodiment of a telecommunications transmission test set.

FIG. 2B shows an embodiment of a telecommunications transmission test set 200 of the invention. Test set 200 includes a light emitting diode (LED) display 212, a graphical display 214, a keypad 216, and an integrated microphone and speaker 218. LED display 212 indicates operational status of test set 200 as well as the operational mode and signal/error conditions. Graphical display 214 displays the test menu, test parameters, and test results. Graphical display 214 can display information in alphanumeric form, graphical form, or a combination of both. Graphical display 214 can be, for example a liquid crystal display (LCD). Graphical display 214 can also be substituted with an alphanumeric display. Keypad 216 allows a user to select a test mode, specify the test conditions, control the test device, dial a phone number, manipulate a graphical display, scroll an alphanumeric display, and perform other functions.

Implementation of some of the features of test set 200 is described in U.S. Pat. No. 5,619,489, entitled "HAND-HELD TELECOMMUNICATION TESTER," issued Apr. 8, 1997, assigned to the assignee of the present invention, and incorporated herein by reference.

Figure 3A:
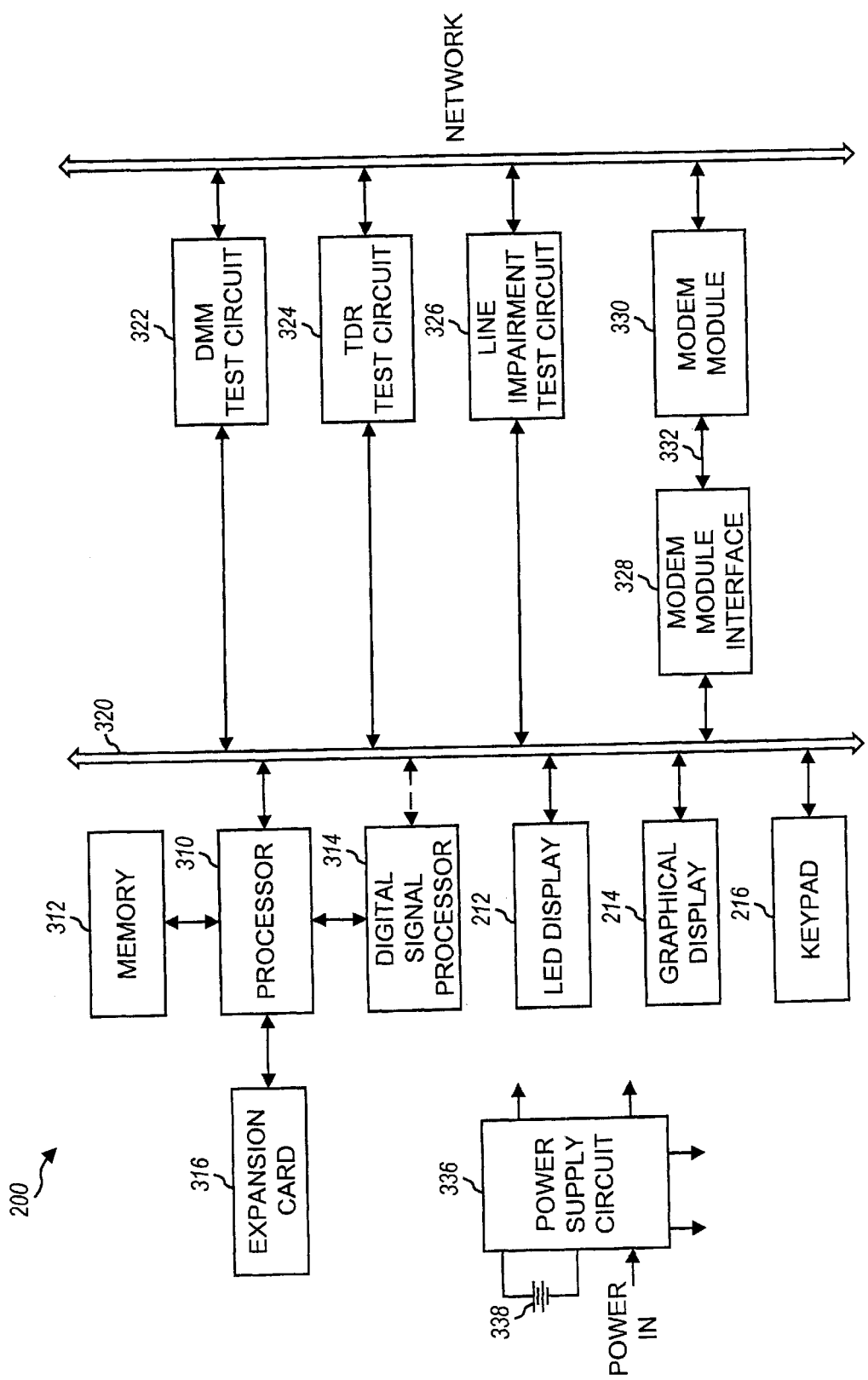
FIG. 3A shows a block diagram of an embodiment of the test set.

FIG. 3A shows a block diagram of an embodiment of test set 200. Within test set 200, a processor 310 controls the operation of the test set according to program instructions stored in a memory 312. A digital signal processor (DSP) 314 can be used to assist in the processing of data samples (i.e., filtering, transformation, and so on). DSP 314 can be implemented, for example, with a digital signal processor from the TMS320 line of processors from Texas Instruments, Inc. An expansion card 316, which is an optional element, allows for easy upgrade to more advanced test features and more applications as they become available. Processor 310 couples to memory 312, DSP 314, and expansion card 316, and further to a bus 320 for communication with other circuits within test set 200. DSP 314 can also couple to bus 320 to directly receive data sent through the bus.

Processor 310 can be implemented with a microcomputer, a microprocessor, a signal processor, an application specific integrated circuit (ASIC), or the like. Memory 312 can be implemented as a random-access memory (RAM), a read-only memory (ROM), a programmable read-only-memory (PROM), an electronically programmable read-only-memory (EPROM), a FLASH memory, registers, or other similar devices. Memory 312 can be used to store the program codes or data, or both.

LED display 212, graphical display 214, and keypad 216 also couple to bus 320. LED display 212 and graphical display 214 receive commands from processor 310 and provide the appropriate output on their respective displays. Keyboard 216 provides the user input to processor 310.

A DMM test circuit 322, a TDR test circuit 324, and a transmission line impairment test circuit 326 couple to bus 320 and to the network under test. Test circuits 322, 324, and 326 provide test signals (e.g., test tones) and perform test measurements for various line qualification tests that are discussed below. Test data generated by the test circuits is provided via bus 320 to processor 310 that further processes the data to generate the final test results which are then displayed. The design for these test circuits are known in the art and are not described.

A modem module interface 328 couples to bus 320 and a modem module 330 via a module bus 332. Modem module 330 facilitates connectivity testing and is further described below. Modem module interface 328 receives data and control signals from bus 320, formats the signals, and forwards the formatted signals to modem module 330. Modem module interface 328 also receives test data from modem module 330 and forwards the data to processor 310. Modem module interface 328 further acts as a conduit for the supply power to modem module 330.

Test set 200 also includes a power supply circuit 336 that provide power to the circuits within test set 200 and modem module 330. Power supply circuit 336 can receive power from a battery pack 362 or an external power supply source. Power supply circuit 336 can be a switching power supply circuit, or other circuits. Power source 336 can also include a charger, such as a battery charger, for charging battery pack 338 with the external power supply source.

Figure 3B:
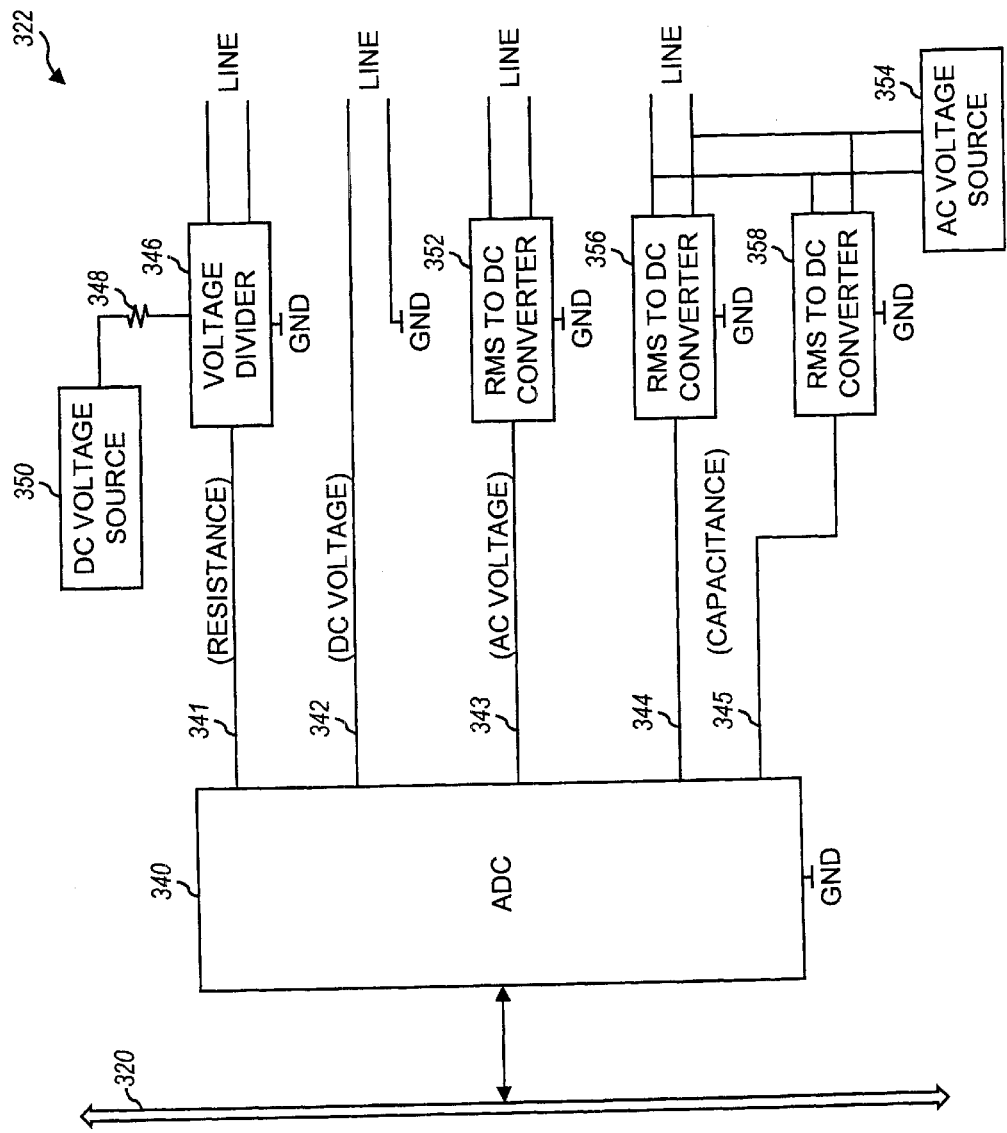
FIGS. 3B–3D show block diagrams of an embodiment of a DMM test circuit, a TDR test circuit, and a line impairment test circuit, respectively.

FIG. 3B shows a block diagram of an embodiment of DMM test circuit 322. In the embodiment shown in FIG. 3B, DMM test circuit 322 measures the line resistance, capacitance, DC voltage, and AC voltage. Initially, the line characteristics are converted into DC voltages by various conversion circuits. An analog-to-digital converter (ADC) 340 then samples the DC voltages on inputs 341 through 345 and provides the sampled values through bus 320 (i.e., to be received by processor 310 and/or DSP 314). The samples are then processed to determine the line characteristics.

For line resistance measurement, a voltage divider 346 converts the line resistance into a DC voltage that is then provided to ADC input 341. Voltage divider 346 couples to input 341, the line to be tested, and a test resistor 348 that further couples to a DC voltage source 350. In an embodiment, DC voltage source 350 provides eighty volts DC and test resistor 348 is forty Kohms. For DC line voltage measurement, the line to be tested is directly coupled to ADC input 342. For AC line voltage measurement, a root-mean-square (RMS) to DC voltage converter 352 converts the AC voltage on the line into a DC voltage at input 343 that is then sampled by ADC 340. And for line capacitance measurement, an AC voltage source 354 provides an AC voltage on the line under test. Two RMS to DC voltage converters 356 and 358 then convert the AC voltage on the line into DC voltages at inputs 344 and 345 that are then sampled by ADC 340. In an embodiment, AC voltage source 354 is a generator that provide a sinusoidal at 20 Hz and having 20 volts peak-to-peak amplitude.

Figure 3C:
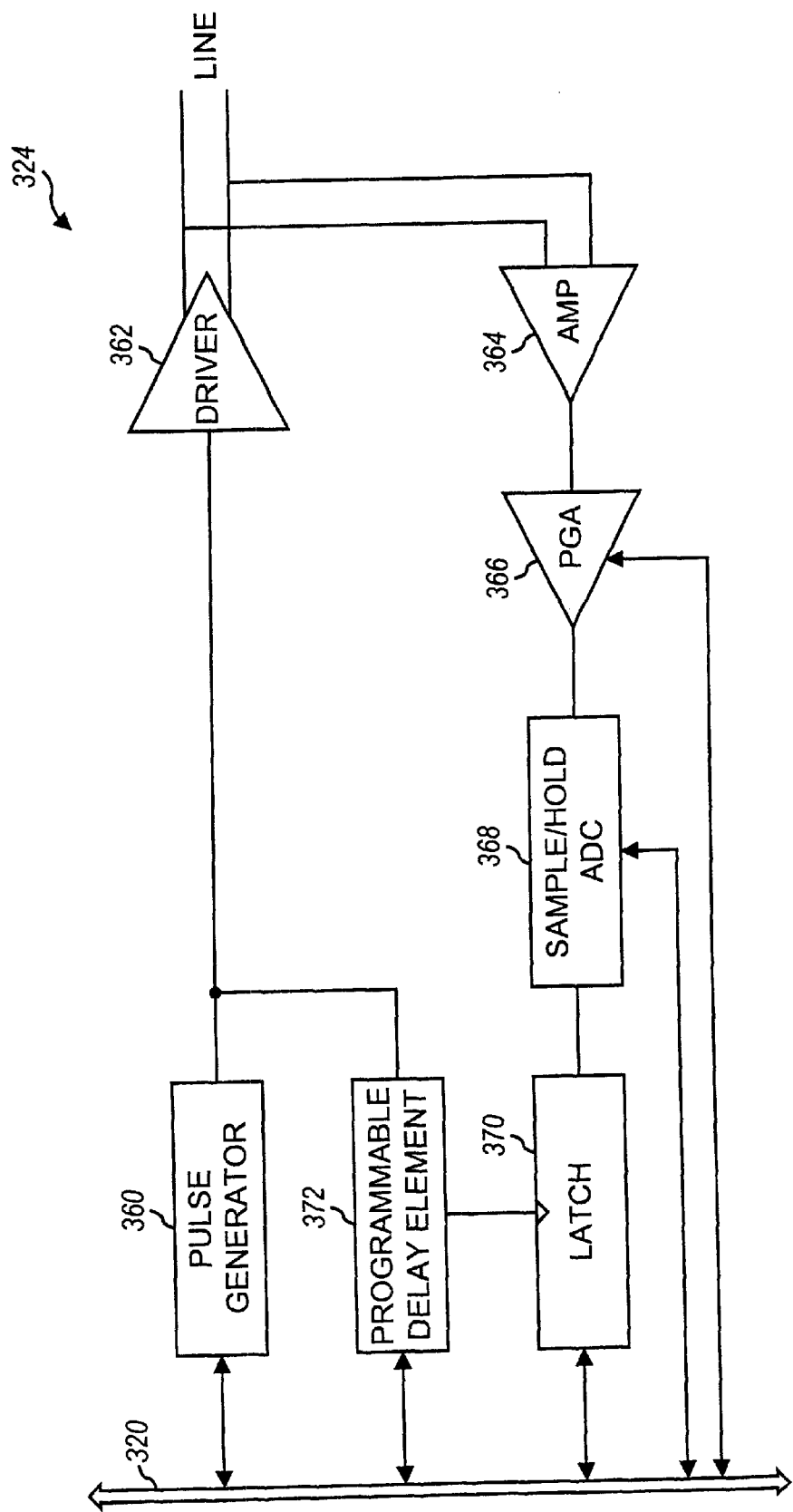

FIG. 3C shows a block diagram of an embodiment of TDR test circuit 324. A pulse generator 360 generates a pulse when directed by processor 310. In an embodiment, pulse generator 360 has a variable time base and generates a single pulse when directed. A signal driver (AMP) 362, which couples to generator 360, receives and conditions the pulse and drives the line to be tested. The reflected pulse is provided to a signal receiver 364 that conditions the received pulse. A programmable gain amplifier (PGA) 366, which couples to signal receiver 364, amplifies the conditioned pulse with a gain programmed by processor 310. A sample and hold analog-to-digital converter (ADC) 368, which couples to gain amplifier 366, samples the amplified pulse to generate sampled values. A latch 370, which couples to ADC 368, latches the sampled values and provides the latched values to bus 320. The pulse generated by generator 360 is also provided to a programmable delay element 372 that delays the pulse by a programmed amount of time and provides the delayed pulse to bus 320. As shown in FIG. 3C, generator 360, delay element 372, latch 370, ADC 368, and gain element 366 couple to bus 320 for receiving command from, and providing data to, other circuit elements that also couple to bus 320 (e.g., processor 310, DSP 314, and others).

Figure 3D:
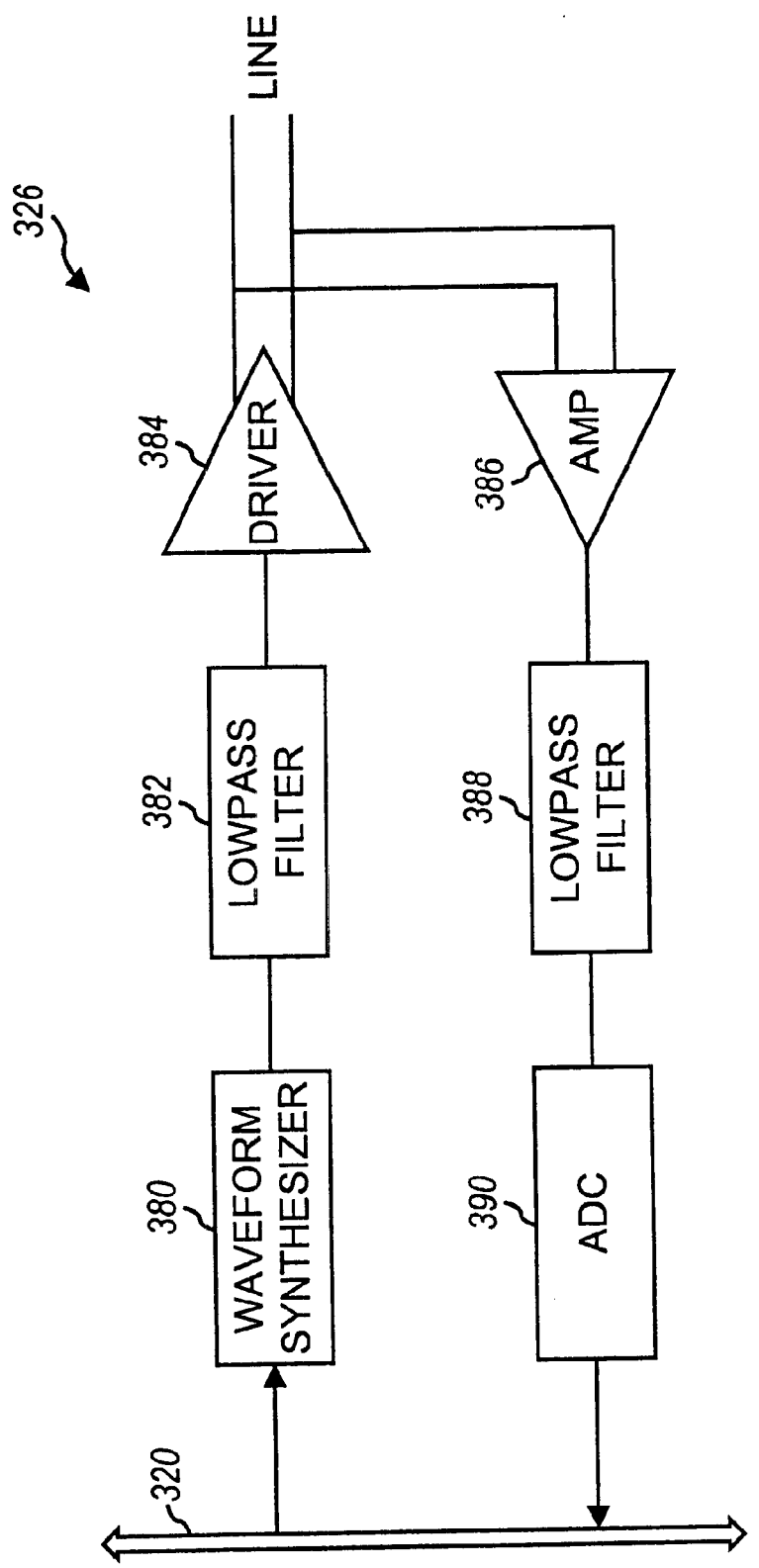

FIG. 3D shows a block diagram of an embodiment of line impairment test circuit 326. A waveform synthesizer 380 generates a waveform (e.g., sinusoidal, squarewave, sawtooth, or others) as directed by processor 310. A lowpass filter 382, which couples to synthesizer 380, receives and filters the generated waveform. A signal driver 384, which couples to filter 382, receives and conditions the filtered signal and drives the line to be tested. The signal on the line is provided to a signal receiver (AMP) 386 that conditions the received signal. A lowpass filter 388, which couples to signal receiver 386, receives and filters the conditioned signal. An analog-to-digital converter (ADC) 390, which couples to filter 388, samples the filtered signal and provides the sampled values to bus 320. The sampled values are received and processed by, for example, processor 310 or DSP 314.

As shown in FIG. 2B, test set 200 is designed to be a portable unit. In particular, test set 200 is dimensioned as a hand-held unit. In a specific embodiment, test set 200 is implemented to weigh less than three pounds, thus improving its portability feature.

Modem Module

Figure 4A:
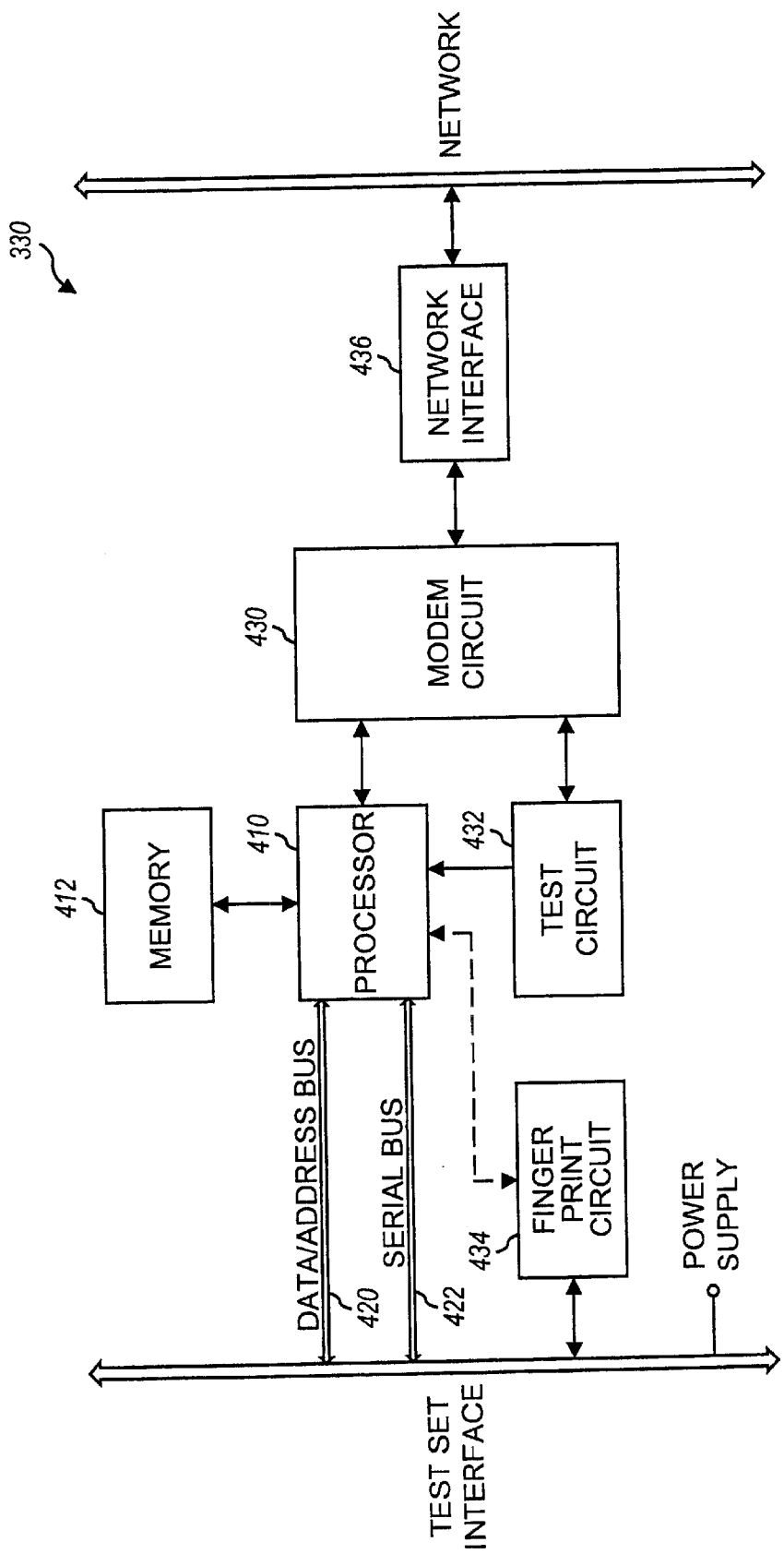
FIG. 4A shows a block diagram of an embodiment of the modem module.

FIG. 4A shows a block diagram of an embodiment of modem module 330. Modem module 330 emulates an actual XDSL modem (e.g., an Alcatel modem, a PairGain modem, or modems manufactured by other vendors) that will eventually be used (i.e., at the customer premises).

As shown in FIG. 4A, modem module 330 includes a processor 410 that controls the operation of modem module 330 according to program instructions stored in a memory 412. Processor 410 couples to modem module interface 328 of test set 200 via a data/address bus 420 and a serial bus 422. Through buses 420 and 422, processor 410 can send data to and receive instructions from test set 200. Processor 410 further couples to a modem circuit 430 and an optional test circuit 432. Processor 410 also optionally couples to a fingerprint circuit 434.

Processor 410 can be implemented with a microcomputer, a microprocessor, a signal processor, an ASIC, or the like. Memory 412 can be implemented as a RAM, a ROM, a PROM, an EPROM, a FLASH memory, registers, or other similar devices. Memory 412 can be used to store the program codes or data, or both.

Modem circuit 430 emulates the actual xDSL modem that will eventually be used for the communications network. Modem circuit 430 generally includes circuits that generate, format, send, receive, and process test data. Circuits that perform at least some of these functions are typically embodied in a chip set that can be obtained from the manufacturer of the actual xDSL modem. A processor within the chip set (not shown in FIG. 4A) typically controls the various functions. Modem circuit 430 can emulate a DSL, HDSL, ADSL, or other xDSL modems. Modem circuit 430 couples to a network interface 436 that provides an interface to the communications network under test. Network interface 436 can also provide circuit protection from transient signals on the network, and other functions.

As shown in FIG. 4A, test circuit 432 couples to processor 410 and modem circuit 430. Test circuit 432 can be used to provide various functions such as, for example, to generate test patterns, to count errors, to generate signals to control the modem, and to facilitate ATM SAR testing.

Modem module 330 also includes a fingerprint circuit 434 that contains a "fingerprint" value. The fingerprint value is an identification value that identifies the a combination of: (1) the modem module type, (2) the software revision number, (3) the authorization codes, and so on, of the particular modem module 330. During an initialization stage, the fingerprint value is provided to test set 200. A table within test set 200 contains a comprehensive list of possible fingerprint values and their corresponding information. Test set 200 then determines the identity of modem module 330 by matching the fingerprint value from module 330 with that from the table.

Test set 200 can then configure itself in accordance with the fingerprint value from module 330. For example, the module type (e.g., Alcatel or PairGain) determines which connectivity test can be performed. The software revision number determines the available tests and test configuration. The authorization code can be used to determine which tests are permissible for that modem module 330. For example, test set 200 can be designed and manufactured with the capability to perform all tests. However, the authorization code of modem module 330 determines which ones of the tests are available (i.e., based upon payment of fees). Thereinafter, if the user selects a test not permitted for that modem module 330, test set 200 can display a screen such as "Test Not Available."

In one embodiment, modem module 330 is implemented as a plug-in card that couples to test set 200. The use of plug-in card is an improvement over conventional test sets that generally include built-in circuits (i.e., fixed cards) within the test set. With the use of a plug-in card, the same test set 200 can be used to test various xDSL modems by simply swapping plug-in cards.

Data/address bus 420 can be a universal data/address/ control bus that is known in the art. Serial bus 422 can be a standard serial bus (i.e., an RS-232C bus having TTL logic levels). As shown in FIGS. 3 and 4, power supply to modem module 330 is provided by test set 200. These various interface form a common interface scheme that allows test set 200 to be coupled to various modem modules.

The common interface scheme also allows test set 200 to control most of the functions of modem circuit 430. For modem circuits that include processors, communications between test set 200 and those modem circuits can be direct. However, for modem circuits that do not include processors, processor 410 provides the necessary interface between test set 200 and those modem circuits.

Figure 4B:
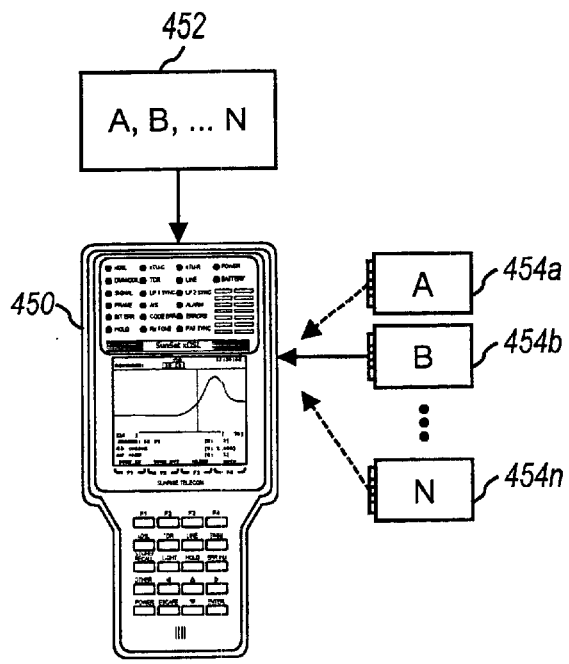
FIG. 4B shows a diagram of an embodiment for identifying a particular modem module to a test set.

FIG. 4B shows a diagram of an embodiment for identifying a particular modem module to a test set. In FIG. 4B, a common software application 452 is installed onto test set 450. For the required testing (i.e., of a particular modem manufactured by a particular vendor), one of a set of modem modules 454 is coupled to (i.e., plugged in) a test set 450. Each of modem modules 454 includes an identification value (e.g., a fingerprint value) that identifies that modem module to test set 450. Test set 450 then executes the portion of the software application applicable for that particular modem module. For example, modem module 454b can be plugged in, and the identification value from modem module 454b directs test set 450 to execute the "B" portion of application 452 that is applicable to modem module 454b.

Figure 4C:
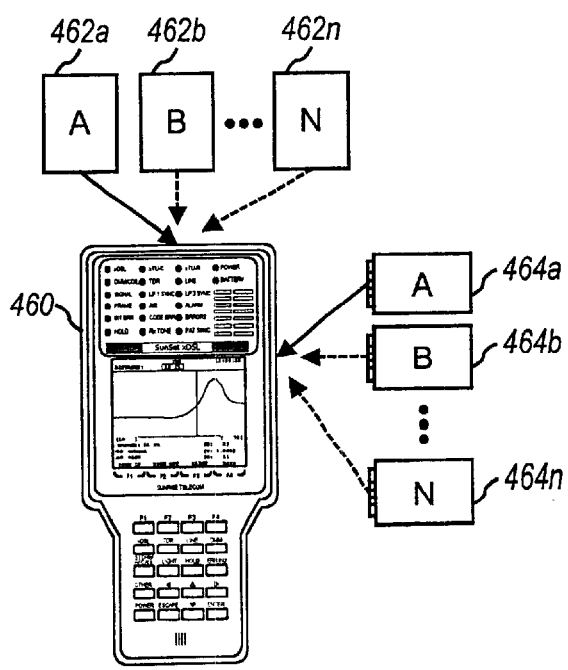
FIG. 4C shows a diagram of another embodiment for matching the proper software application with a particular modem module.

FIG. 4C shows a diagram of another embodiment for matching the proper software application with a particular modem module. As shown in FIG. 4C, a test set 460 can be loaded with one of a number of software applications 462a through 462n. Each software application 462 is designed for operation with a particular modem module 464. In this embodiment, when a particular modem module 464 is plugged in, the corresponding software application 462 is loaded onto test set 460 for execution. As shown in FIG. 4C, modem module 464a is plugged in test set 460 and corresponding software application 462a is installed.

Menu Screen

Referring back to FIG. 2B, a menu screen can be displayed on graphical display 214 upon power up of test set 200. The menu screen allows the user to: (1) change test parameters; (2) select the test to be performed; (3) store and recall test setup and/or results information; and so on. The user can navigate through the menu screen using keypad 216.

Figure 5:
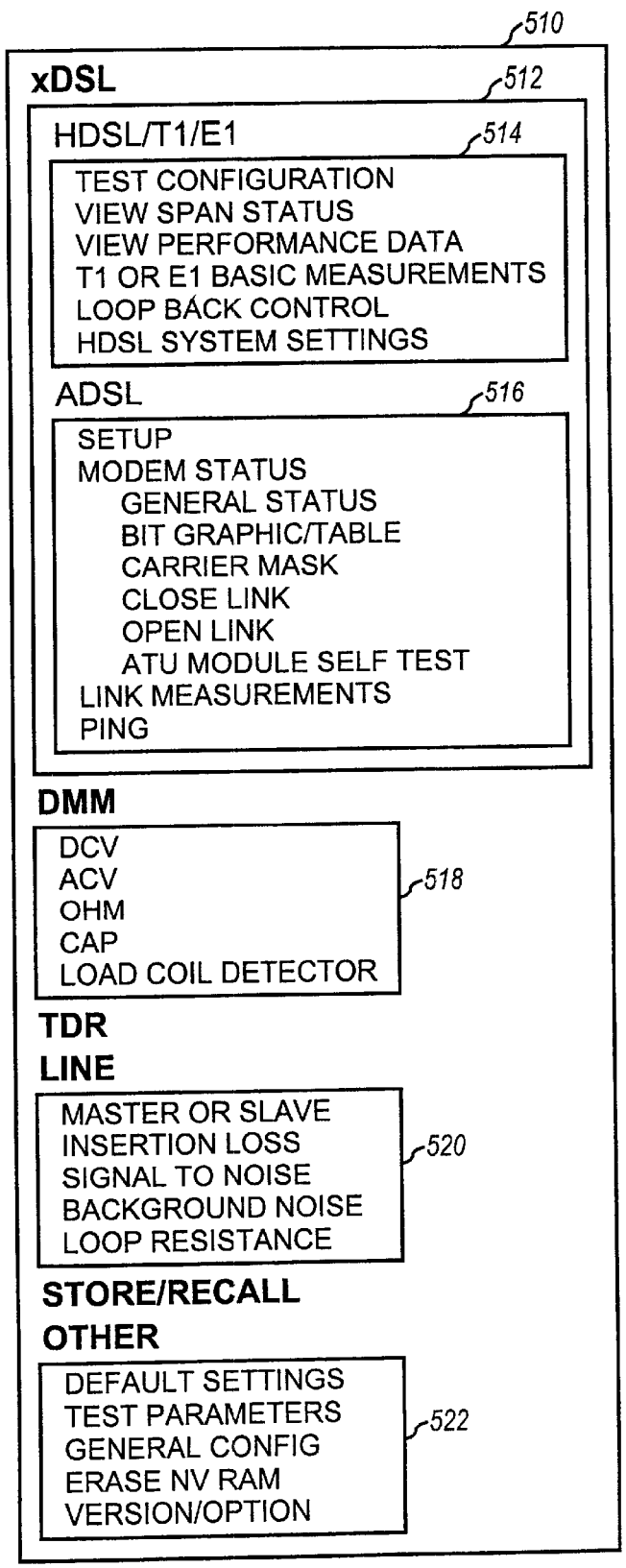
FIG. 5 shows one embodiment of a menu tree.

FIG. 5 shows one embodiment of a menu tree. A main menu 510 can be displayed upon power up of test set 200 or by depressing a proper key on keypad 216. As shown, main menu 510 includes the following choices: (1) XDSL, (2) DMM, (3) TDR, (4) Line, (6) Store/recall, and (6) other. Upon selecting the "xDSL" choice, a menu 512 is displayed. Menu 512 includes the following choices: (1) HDSL and (2) ADSL. Upon selecting the "HDSL" or "ADSL" choice, a menu 514 or 516 lists the available setup and test options.

Similarly, upon selecting the "DMM" choice in main menu 510, a menu 518 lists the available tests. Upon selecting the "Line" choice, a menu 520 lists the available tests. And upon selecting the "Other" choice, a menu 522 lists the available configuration and setup choices. For each of the menus described above, additional or different choices can be provided depending on the capability and design requirements of test set 200.

Test Capabilities

In one embodiment, test set 200 is capable of performing both line qualification and connectivity testing to allow complete installation, maintenance, and repairs of a xDSL connection. The test features are described below.

Line Qualification Tests

Line qualification includes a variety of tests that measure the quality or transmission capability of a wire pair. These tests can be grouped into three categories: (1) digital multimeter (DMM), (2) time domain reflection (TDR), and (3) transmission line impairments. DMM measurements can be used to detect shorts in the wire pair. TDR tests can be used to locate cable faults, such as the presence of loading coils, bridge taps, water, and so on. Transmission line impairment tests can be used to characterize the transmission capabilities of the line and to determine if the wire pair is suitable for xDSL transmission within a predetermined frequency range (e.g., 10 KHz to 1.5 MHz).

Digital Multimeter (DMM) Tests

Figure 6A:
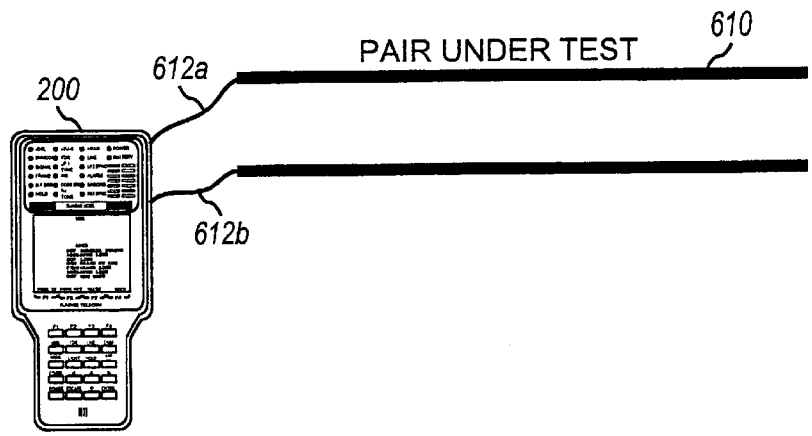
FIG. 6A shows a test set up for DMM measurements.

FIG. 6A shows a test set up for DMM measurements. Test set 200 couples to a wire pair 610 through a pair of clip cables 612. For a DMM measurement, a voltage is generated by test set 200 and provided across wire pair 610. Current is then detected from wire pair 610 to determine whether a short (i.e., low impedance or high impedance short) exists in wire pair 610. The various DMM functions are known in the art and are not discussed in detail in this specification.

In DMM mode, test set 200 can be used as a voltmeter or an ohmmeter. As a voltmeter (for both DC and AC voltage measurements), test set 200 can detect and measure (foreign) voltages on a wire pair. As an ohmmeter, test set 200 can be used to measure the resistance of a span of a wire pair. Generally, the resistance of a span is greater than five Mohm between a tip wire and ground and also between a ring wire and ground. Test set 200 can also measure the capacitance of a wire pair, which is helpful to determine the length of a line.

Test set 200 can also be used to measure loop resistance between a central office and the customer premises. The loop resistance is a DC measurement of the line. In one implementation of this test, two test sets are used, one located at the central office and the other at the customer premises. In an alternative implementation, one test set is used and the far end of the line is shorted. The loop resistance measurement can be used to verify that continuity exists between the central office and the customer premises and that no physical faults (e.g., grounds, shorts, or opens) exist in the loop.

For the various tests, the test result can be displayed on graphical display 214. Generally, an alphanumeric display of the measured voltage, resistance, or capacitance is adequate. The values can also be automatically scaled (i.e., using nano, micro, milli, kilo, mega, or other suitable prefixes) and formatted.

Time Domain Reflectometer (TDR) Tests

TDR operates by sending a test pulse down a wire pair and measuring the reflections to determine "events" along the wire pair. The reflections are influenced both by events that are normally expected (i.e., gauge changes and splices) and events that are undesirable (i.e., water, shorts, and opens). The events identify changes in the impedance of the wire pair, such as those caused by changes in: (1) insulation material (e.g., water), (2) conducting material (e.g., corrosion), (3) capacitance (e.g., a split), and others.

For TDR tests, the configuration as shown in FIG. 6A is used. Test set 200 sends out pulses of energy, one pulse at a time. When a reflection occurs, test set 200 measures the amplitude of the reflected pulse and the time interval between the transmission of the pulse to the reception of the reflected pulse. The measured time interval is used to determine the distance to the event. The amplitude of the reflected pulse is then plotted against distance. A bump (i.e., upward deflection from a baseline measurement) in the display indicates a high-impedance event. Alternatively, a dip (i.e., downward deflection from a baseline measurement) indicates a low-impedance event, such as a short. Based on the graphical display, a user can determine a fault and the distance to the fault.

Figure 6B:
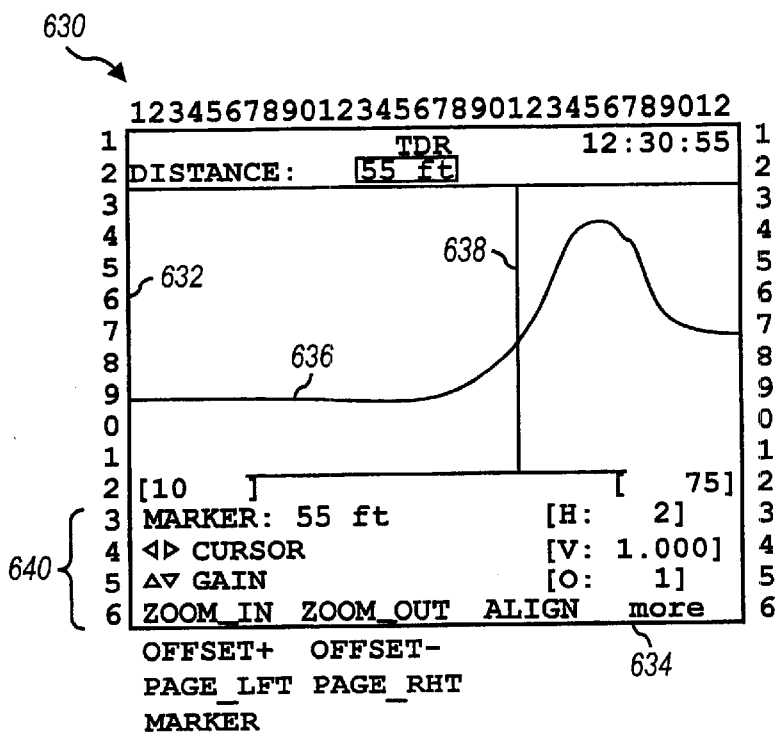
FIG. 6B shows graphical display of TDR test results, with "cursor" control.

FIG. 6B shows a graphical display of TDR test results, with "cursor" control. A result screen 630 can be reached from other menus of test set 200 by depressing the proper key on keypad 216. A vertical axis 632 represents the amplitude of the measured reflected pulse. A horizontal axis 634 represents distance. The vertical scale on axis 632 can be adjusted by depressing the Up and Down arrow keys on keypad 216. Similarly, the horizontal scale on axis 634 can be adjusted by depressing the F-keys on keypad 216. An output graph 636 represents the measured results of the TDR measurement. Screen 630 also includes a cursor 638 that can be moved left or right by the Right and Left arrow keys on keypad 216.

An alphanumeric display section 640 lists pertinent data associated with the reflected pulse at the location of cursor 638. The data can include the amplitude of the reflected pulse, the distance to cursor 638, and so on. At the bottom of display section 640 are listed display options that can be selected using the Function keys. The options can include zoom in, zoom out, offset+, offset−, page left, page right, and so on.

In one embodiment, as cursor 638 is moved to a pulse, vertical axis 632 is automatically adjusted (i.e., by adjusting the vertical gain, the vertical offset, or both) so that the pulse fits within screen 630. The pulse can also be moved to the center of screen 630 by depressing another key (not shown).

Figure 6C:
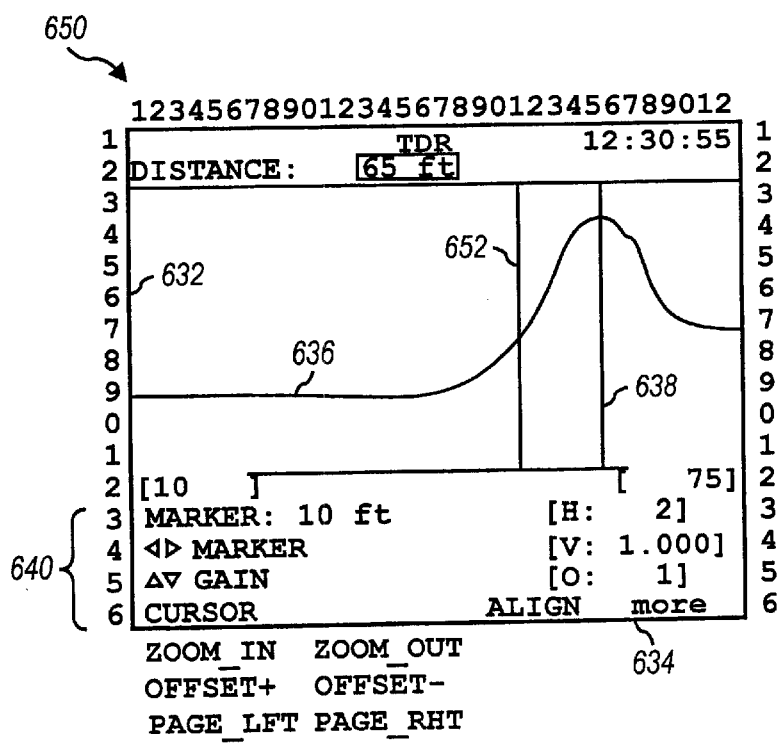
FIG. 6C shows a graphical display of TDR test results, with "marker" control.

FIG. 6C shows a graphical display of TDR test results, with "marker" control. A result screen 650 is similar to result screen 630, but includes a marker 652 that can be selected with, for example, the F1 key (see above discussion related to FIG. 6B). The marker can be moved left or right by depressing the left or right arrow key on keypad 216. However, instead of listing the data at cursor 638 as with screen 630, display section 640 lists the difference between marker 652 and cursor 638.

TDR can be used to locate various impairments in a wire pair that are detrimental for high-speed data transmission. The impairments include load coils, split pairs, bridge taps, laterals, water, intermittent faults, and so on. A load coil is an inductive component placed on a telephone line to improve the frequency response over the audio band (i.e., for voice communication). However, the load coil causes a sharp roll off at high frequency and needs to be removed for high-speed digital data transmission. A split pair is caused when two tips of the same color, but from different pairs, are inadvertently spliced together. A bridge tap (i.e., similar to a splice) is interposed on a wire pair to allow attachment an additional circuit to the wire pair. A lateral is a portion of a cable pair that is not in the direct path between the central office and the customer.

TDR tests are further described in a product application note entitled "Time Domain Reflectometry Theory" published by Hewlett-Packard Company in May 1998. Methods for determining fault locations are further described in a product application note entitled "Accurate Transmission Line Fault Location Using Synchronous Sampling" published by Hewlett-Packard Company in June 1998. Techniques for determining fault locations are also described in a product application note entitled "Traveling Wave Fault in Power Transmission Systems" published by Hewlett-Packard Company in February 1997. These application notes are incorporated herein by reference.

Transmission Line Impairment Tests

Figure 7:
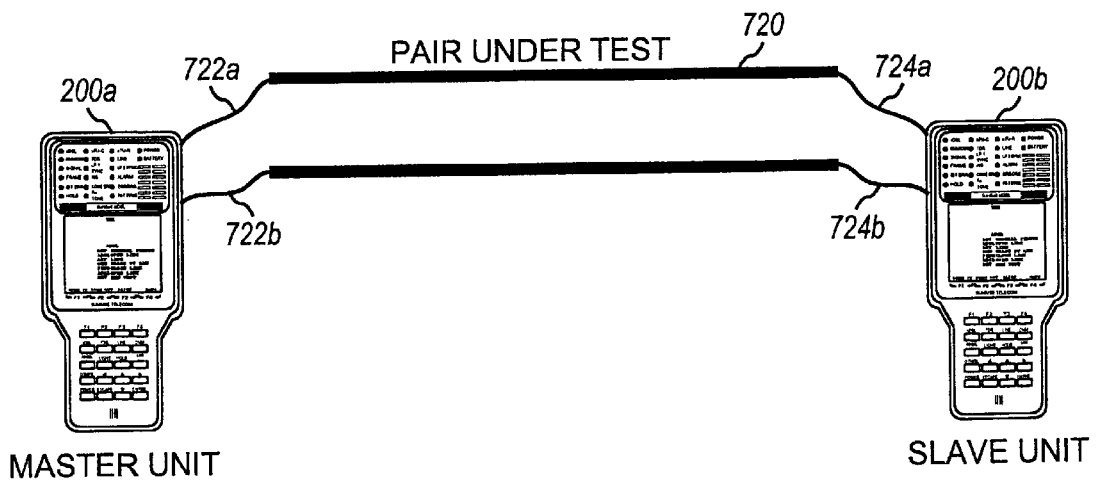
FIG. 7 shows a test set up for transmission line impairment testing.

FIG. 7 shows a test set up for transmission line impairment testing. For this testing, two test sets 200a and 200b are used. Test sets 200a and 200b couple to wire pair 720 through respective pairs of clip cable 722 and 724. Test sets 200a and 200b are configured in a particular manner, depending on the test being conducted. Generally, master test set 200a conducts the measurements and slave test set 200b generates the required tones and properly terminates the far end of wire pair 720. Transmission impairment tests are further described in the publication ANSI T1.413, which is incorporated herein by reference.

FIG. 8A shows an embodiment of a menu 810 for transmission line impairment testing. Menu 810 can be reached from other menus of test set 200 by depressing the proper key on keyboard 216. Transmission impairment testing consists of the following measurements: (1) insertion loss, (2) signal-to-noise, (3) background noise, (4) loop resistance, and others. Also shown in menu 810 is a mode selection (i.e., master or slave) for the test unit.

Insertion Loss

Insertion loss measures signal attenuation versus frequency across the wire pair. For insertion loss measurement, slave test set 200b sends a tone from the far end of the wire pair. Master test set 200a then measures the signal at the near end. Data is collected for a series of tone at various frequencies.

FIG. 8B shows a menu 820 that lists sets of test frequencies for insertion loss measurement. For ADSL discrete multi-tone (DMT) test, measurements are collected for 256 frequencies. Other test frequencies include: (1) 196 KHz for HDSL 2-pair T1, (2) 392 KHz for HDSL 1-pair T1, (3) 260 KHz for HDSL E1, (4) 40 KHz for ISDN U interface, (5) 96 KHz for ISDN S interface, (6) 82 KHz for DDS, (7) 772 KHz for T1, and (8) 1.024 MHz for E1. Alternatively, although not shown as a choice in FIG. 8B, the user can select a test frequency range and a frequency step size, thereby determining the frequencies to be tested.

Figures 8C, 8D:
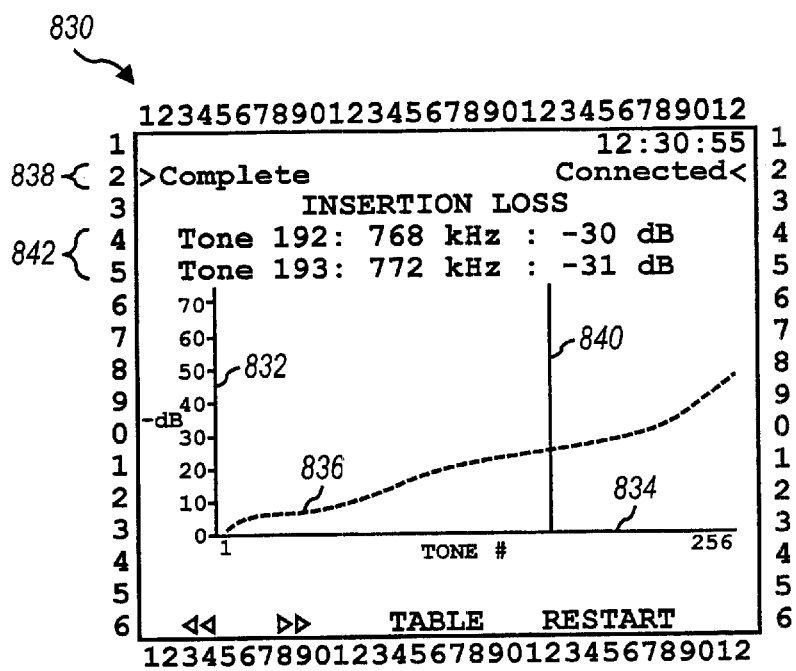
FIG. 8C shows a graph of an insertion loss test result.
FIG. 8D shows an alphanumeric display of insertion loss test results.

FIG. 8C shows a graph of an insertion loss test result. A result screen 830 can be reached from other menus of test set 200 by depressing the proper key on keyboard 216. A vertical axis 832 represents the value of the insertion loss measurement. A horizontal axis 834 represents frequency or the tones of interest. An output graph 836 represents the measured result of the insertion loss measurement. A result can be plotted as each data point (or each frequency) is collected. A status message 838 indicates the status of the test. For example, "Testing" can be used to show that testing is in progress and "Complete" can be used to show that testing is finished. A cursor 840 can be placed anywhere on output graph 836. An alphanumeric display section 842 lists pertinent data associated with the test result at the location of cursor 840. Vertical axis 832, horizontal axis 834, and cursor 840 and be adjusted in similar manner to that described above for the TDR test.

FIG. 8D shows an alphanumeric display of insertion loss test results. A result screen 850 lists the frequencies and the corresponding measured values. Screen 850 can be used to display a more precise listing than output graph 836 shown in screen 830.

Although not shown, a setup screen can be created for the graph configuration and default values being used. The setup screen can include: (1) the unit being used (i.e., English or metric), (2) the gauge of the wire, (3) the propagation velocity, (4) the cable length, and other information.

Signal-to-Noise Ratio

Signal-to-noise ratio (SNR) measures the noise on a wire pair over a frequency band of interest. Referring to FIG. 7, for signal-to-noise ratio measurement, slave test set 200b sends a tone from the far end of wire pair 720. Master test set 200a then performs measurements at the near end. The test result is then displayed. As with the insertion loss measurement, various frequencies can be tested for different operating modes.

In one embodiment, the SNR measurement is computed in accordance with the following equation:

$$\text{SNR=Signal (dBm/Hz)-Noise (dBm/Hz)}, \quad \text{Eq. (5)}$$

where Signal and Noise are the signal and noise power, respectively, in units of dBm/Hz. In accordance with ANSI T1.413 specification, equation (5) can be expressed as:

$$\text{SNR=-40 dBm/Hz-Insertion Loss (dB)-Noise (dBm/Hz)}, \quad \text{Eq. (6)}$$

where Insertion Loss is the insertion loss of the line under test.

FIG. 8E shows an alphanumeric display of a signal-to-noise test result. A result screen 860 lists the frequency under test and the signal-to-noise ratio measurement result. Additional information (not shown) can also be displayed on screen 860, such as the center frequency and the noise bandwidth, the start and stop frequency, the noise filter used, and so on.

Background noise

Background noise measures the noise characteristics on the wire pair over a frequency band of interest. Referring back to FIG. 7, for background noise measurement, slave test set 200b terminates the far end of wire pair 720 with the characteristic impedance of wire pair 720. Master test set 200a then performs measurement of the extraneous signals at the near end. A filter within test set 200a can be used for improved measurements. Example filters include: (1) an E-filter having a (−3 dB) passband of 1 KHz to 50 KHz (for ISDN BRA DSL) and a characteristic impedance of 135 ohm, (2) an F-filter having a passband of 5 KHz to 245 KHz (for HDSL) and a characteristic impedance of 135 ohm, (3) an G-filter having a passband of 20 KHz to 1.1 MHz (for ADSL) and a characteristic impedance of 100 ohm, and other filters.

FIG. 8F shows a graphical display of background noise test results. A result screen 870 includes a vertical axis 872, a horizontal axis 874, an output graph 876, and a cursor 878. Screen 870 can also include a status message 880 indicating the status of the test. A result can be plotted as each data point (i.e., for a frequency) is collected. Cursor 878 can be placed anywhere on output graph 876. An alphanumeric display section 882 lists pertinent data associated with the test result at the location of cursor 878. Vertical axis 872, horizontal axis 874, and cursor 878 and be adjusted in similar manner to that described above. The results shown in screen 870 can also be displayed on an alphanumeric table, as described above. Furthermore, the background noise of the filters used in the testing can also be measured and displayed.

Loop resistance

Loop resistance measures the impedance of a wire pair. Referring back to FIG. 7, for loop resistance measurement, slave test set 200b short circuits the far end of the wire pair. Master test set 200a then performs measurements at the near end. The test result is then displayed.

Connectivity Testing

After a line has been qualified, connectivity testing is typically performed to verify proper operation of the actual xDSL modem cards to be used. Typically, a plug-in card that emulates the xDSL modem is installed on the test set. Then, a set of tests is performed to measure the quality of data transmission through the xDSL modem. Connectivity tests include: (1) HDSL transceiver unit—remote terminal end (HTU-R) or HDSL transceiver unit—central office end (HTU-C) function, (2) xDSL payload bit-error-rate test (BERT), (3) xDSL T1/E1 framed BERT, (4) BERT using one of a set of predetermined pattern, (5) HTU-R and HTU-C loopback codes, (6) HTU-C line power generation implemented by an external power supply, (7) HTU-R acceptance of line power from HTU-C, and other tests.

The use of the plug-in card (or a "universal" plug-in) provides many advantages. Generally, the modem interface is unique from one modem vendor to another. For example, Alcatel SA, Motorola Inc., Pairgain Technologies Inc., NEC Corporation, and Lucent Technologies Inc. are among the vendors that use different modem chip sets having different interfaces. The plug-in card of the invention can be designed to interface with these various modems, thereby allowing testing of multiple (seemingly incompatible) modems with one test set.

A network can be viewed as being composed of various layers, with each layer performing a defined function. Each layer communicates with the layer above or below it, or both. An Open System Interconnection (OSI) network is composed of seven layers including: (1) a physical layer, (2) a data link layer, (3) a network layer, (4) a transport layer, (5) a session layer, (6) a presentation layer, and (7) an application layer. The physical layer transmits bit streams across the physical transmission system. The data link layer provides for a reliable data transmission. The network layer routes data from one network node to another. The transport layer provides data transfer between two users at a predetermined level of quality. The session layer manages the data exchange. The presentation layer presents information to the users in a meaningful manner. Finally, the application layer monitors and manages the computer network. The layers are further described by G. Nunemacher in "LAN Primer", M & T Books, pg. 179–181, which is incorporated herein by reference.

Layer 1 testing by test set 200 includes BERT, loopback control test, and other tests. BERT includes tests using any permutation of the following parameters: (1) T1 or E1, (2) in HTU-C mode, in HTU-R mode, from T1 access point, or from E1 access point. Loopback control test includes HTU-C, HTU-R, and CSU/NIU tests.

Layer 2 testing by test set 200 includes emulation, loopback, and other tests. For HDSL, HTU-R emulation, HTU-C emulation, HTU-R loopback, and HTU-C loopback can be performed. HTU-R loopback is a regenerative loop back of the DSX-1 signal toward the network and HTU-C loopback is a regenerative loop back of the DS1 signal toward the network.

Layer 3 testing by test set 200 includes IP ping test and other tests. As an analogy, testing layer 2 and 3 is akin to testing a microphone by saying "hello." For this test, a source unit sends a message to a far end unit that replies with a message back to the source unit.

The test set of the invention can be designed to test various protocols including ISDN, Asynchronous Transfer Mode (ATM), Frame Relay, and others. ATM interoperability testing is further described in a product literature entitled "Testing ATM Interoperability," published by Hewlett-Packard Company in June 1997, and incorporated herein by reference.

Emulation

Figure 9A:
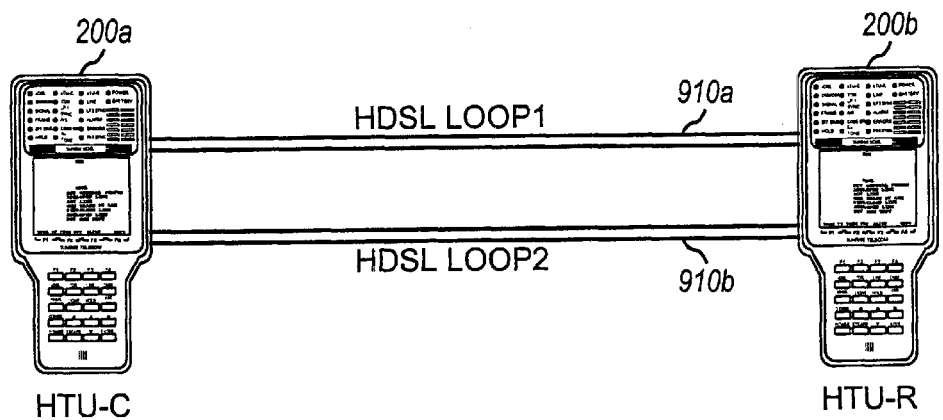
FIG. 9A shows a test set up for dual HTU-C and HTU-R emulation over two wire pairs.

FIG. 9A shows a test set up for dual HTU-C and HTU-R emulation over two wire pairs. Test set 200a couples to one end of wire pairs 910a and 910b. Test set 200b couples to the other end of wire pairs 910a and 910b. The emulation test is used to verify that the wire pairs can support HDSL with an acceptable error rate.

Figure 9B:
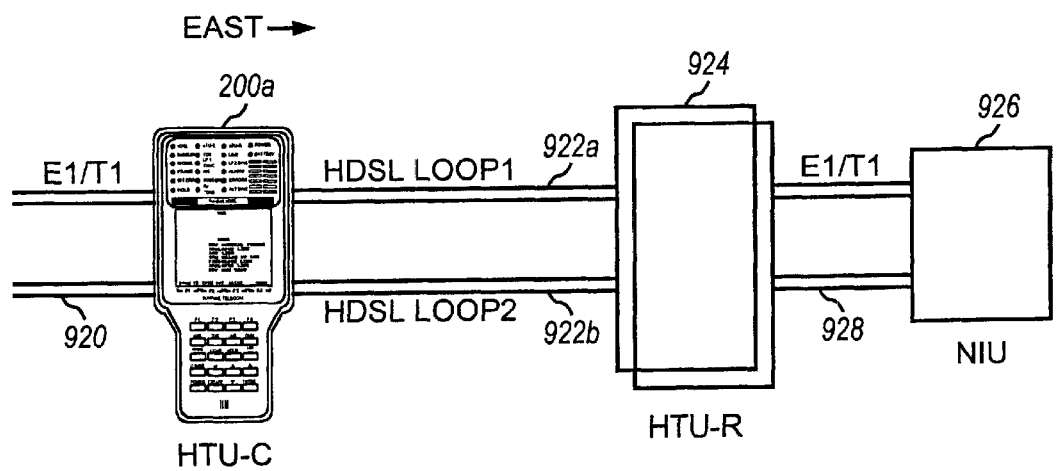
FIG. 9B shows a test set up for in-service HTU-C or HTU-R function.

FIG. 9B shows a test set up for in-service HTU-C or HTU-R function. Test set 200a couples to a T1/E1 connection 920 and to one end of wire pairs 922a and 922b. The other end of wire pairs 922a and 922b couples to an HTU-R 924 that further couples to a NIU 926 through a T1/E1 connection 928.

Figure 9C:
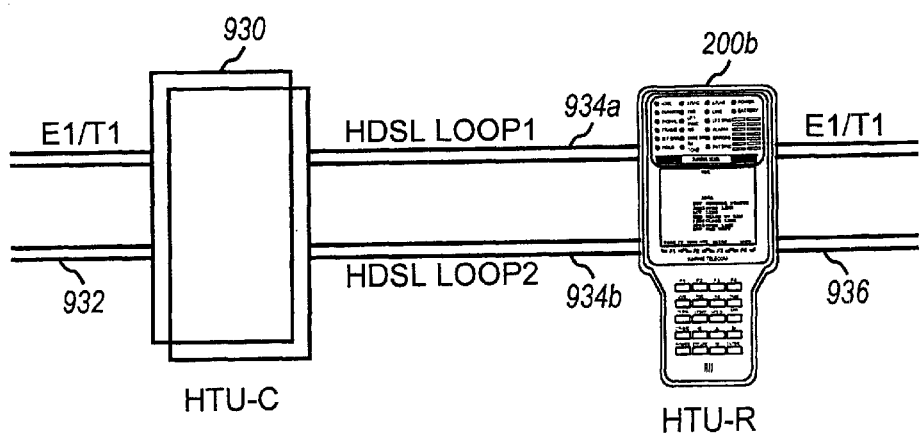
FIG. 9C shows a complementary test set up to that of FIG. 9B.

FIG. 9C shows a complementary test set up to that of FIG. 9B. HTU-C couples to a T1/E1 connection 932 and to one end of wire pairs 934a and 934b. The other end of wire pairs 934 couples to test set 200b that further couples to a T1/E1 connection 936.

In the in-service HTU-C or HTU-R function mode, test set 200 can perform the following tests: (1) in-service BERT (east or west), (2) respond to loopback commands, (3) report modem status, (4) in-service HTU monitoring measurements, and others. In this mode, the test set simulates a line terminating unit (LTU) or a networking terminating unit (NTU).

Figure 9D:
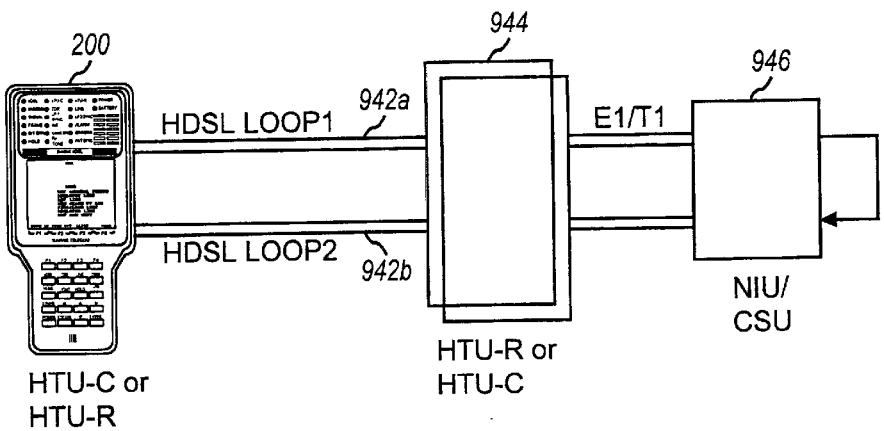
FIG. 9D shows a test set up for out-of-service HTU-C and HTU-R function.

FIG. 9D shows a test set up for out-of-service HTU-C and HTU-R function. Test set 200 couples to one end of wire pairs 942a and 942b. The other end of wire pairs 942a and 942b couples to an HTU-R or an HTU-C 944 that further couples to a NIU/CSU 946. NIU/CSU 946 is configured as a loopback.

In the out-of-service HTU-C and HTU-R function mode, test set 200 can perform the following tests: (1) BERT at T1, (2) HTU/T1 loopback, (3) modem status, and others. These tests implement the HDSL loopback test.

Figure 9E:
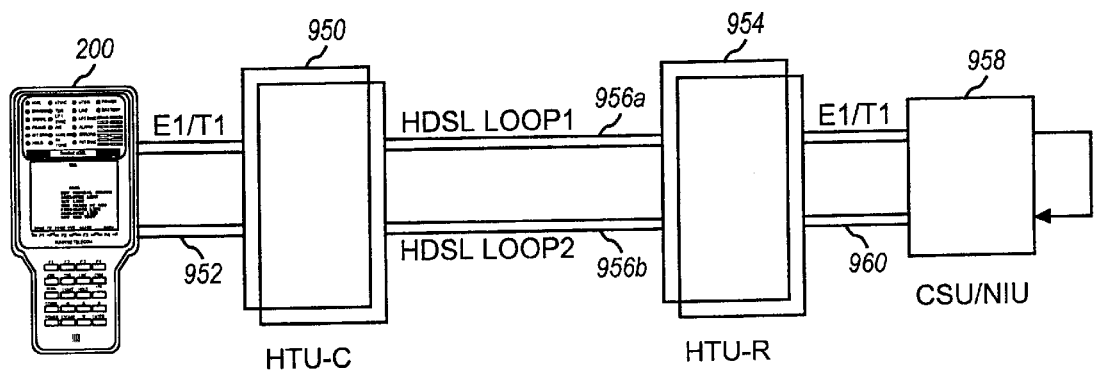
FIG. 9E shows a test set up for E1 and T1 testing on a HDSL span.

FIG. 9E shows a test set up for E1 and T1 testing on a HDSL span. Test set 200 couples a HTU-C 950 through a T1/E1 connection 952. HTU-C 950 couples to HTU-R 954 through wire pairs 956a and 956b. HTU-R 954 couples to a CSU/NIU 958 through another T1/E1 connection 960. CSUNMU 958 is configured as a loopback.

In the E1 and T1 testing mode, test set 200 can perform the following tests: (1) E1/T1 end-to-end BERT, (2) E1/T1/HTU loopback control, and others. These tests implement the T1 loopback test.

Figure 9F:
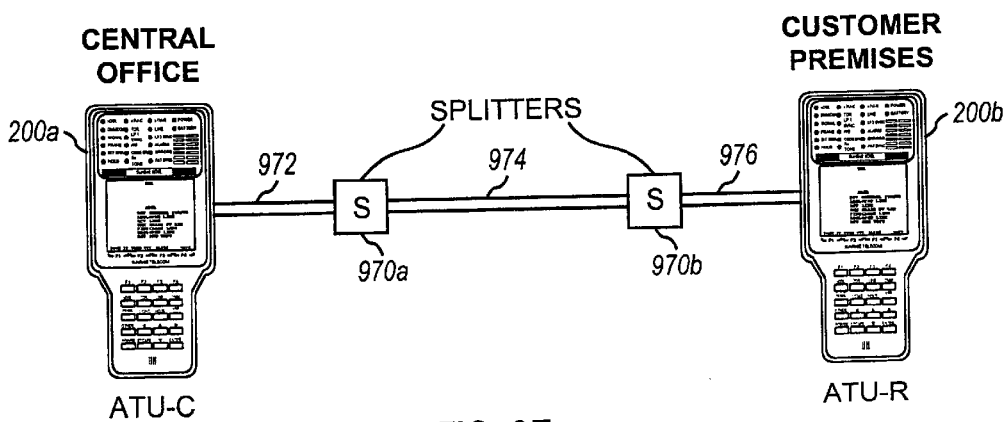
FIG. 9F shows a test set up for simultaneous ATU-C and ATU-R emulation.

FIG. 9F shows a test set up for simultaneous ATU-C and ATU-R emulation. Test set 200a couples a splitter 970a through a connection 972. Splitter 970a couples to another splitter 970b though a wire pair 974. Wire pair 974 is the connection being tested. Test set 200b couples to splitter 970b through a connection 976.

In the simultaneous ATU-C and ATU-R emulation mode, test sets 200 verifies that the wire pairs can carry ADSL with an acceptable error rate.

Figure 9G:
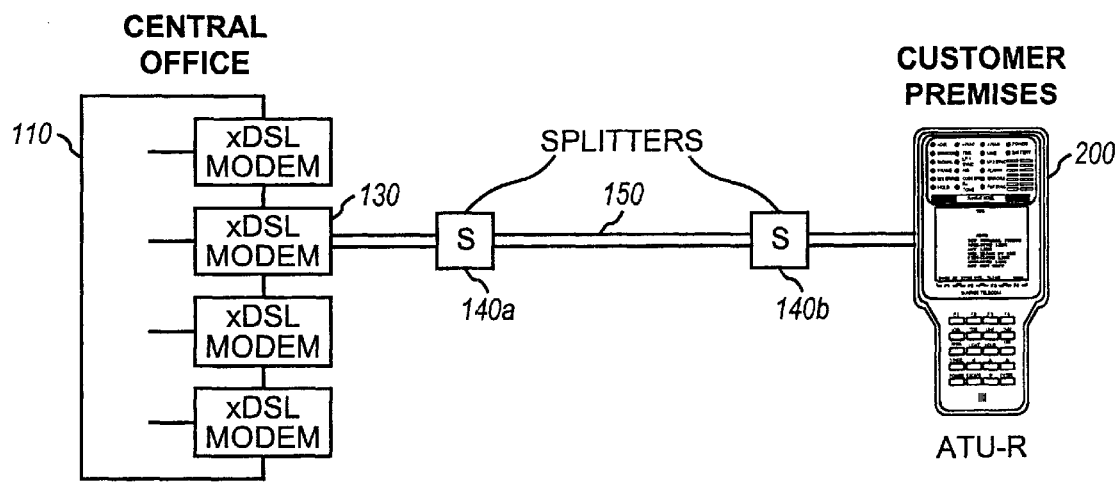
FIG. 9G shows a test set up for testing ATU-C function.

FIG. 9G shows a test set up for testing ATU-C function. This test set up is similar to the configuration shown in FIG. 2A, except that the modem at the customer premises is replaced by test set 200.

Figure 9H:
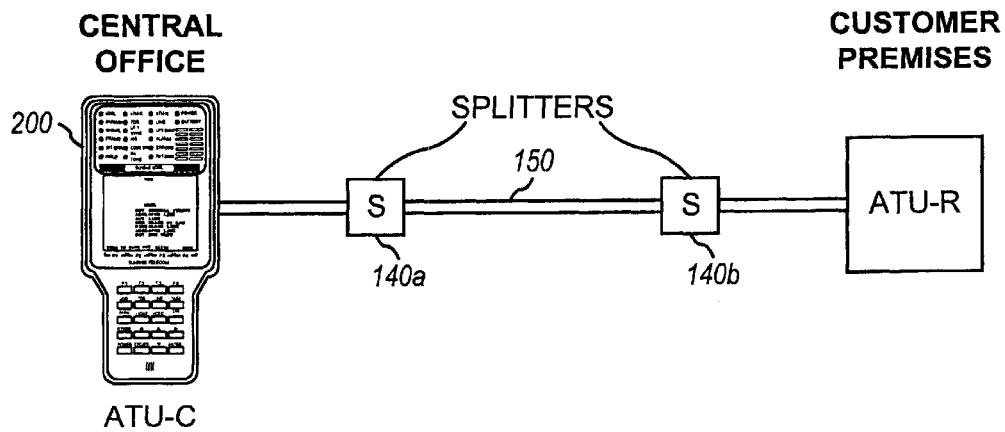
FIG. 9H shows a test set up for testing ATU-R function.

FIG. 9H shows a test set up for testing ATU-R function. This test set up is similar to the configuration shown in FIGS. 1 and 9G, except that the modem at the central office is replaced by test set 200.

In the ATU-C and ATU-R function mode, test sets 200 verifies that the customer premise equipment is working properly.

The foregoing description of the specific embodiments is provided to enable any person skilled in the art to make or use the present invention. Various modifications to these embodiments will be readily apparent to those skilled in the art, and the generic principles defined herein may be applied to other embodiments without the use of the inventive faculty. For example, a test set can be designed with more or fewer line qualification tests and more or fewer connectivity tests than those disclosed. Furthermore, different graphical displays can be generated for the test results. Thus, the present invention is not intended to be limited to the embodiments shown herein but is to be accorded the widest scope consistent with the principles and novel features disclosed herein and as defined by the following claims.

What is claimed is:

1. A computer program product for detecting presence of a bridge tap in a transmission line comprising an electronic storage unit encoded with coded instructions configured to direct transmission of test signals of predetermined frequencies into a transmitting end of the transmission line;

coded instructions configured to detect the test signals at a receiving end of the transmission line;

coded instructions configured to compute amplitudes of the detected test signals;

coded instructions configured to compute a frequency response of the transmission line based on the computed amplitudes;

coded instructions configured to receive a signal indicative of a detected frequency-domain signature in the frequency response of the transmission line; and coded instructions configured to identify the presence of the bridge tap based on the signal indicative of the identified frequency-domain signature.

2. The product of claim 1 further comprising:

coded instructions configured to execute a time domain reflectometer (TDR) test; and coded instructions configured to determine a location of the identified bridge tap based on results from the TDR test.

3. The product of claim 1 wherein the frequency-domain signature comprises a set of one or more attenuation dips in the frequency response, wherein each attenuation dip is a local minima in the frequency response.

4. The product of claim 3 further comprising:

coded instructions configured to compute a length of the bridge tap based on a frequency of a first attenuation dip in the set of one or more attenuation dips.

5. A test set for detecting presence of a bridge tap in a transmission line comprising:

at least one signal input port;

test circuitry coupled to the at least one signal input port, the test circuitry configured to receive signals from the signal input port and generate data indicative of amplitude of the received signals;

a processor coupled to the test circuitry, the processor configured to receive the data indicative of amplitude of the received signals and generate a frequency response;

a display operatively coupled to the processor, the display configured to receive and display the frequency response, wherein the frequency response is used in identifying the presence of a frequency-domain signature associated with a detectable type of bridge tap in the transmission line.

6. The test set of claim 5 wherein the frequency response is displayed as a graphical plot.

7. The test set of claim 5 wherein the frequency-domain signature associated with a bridge tap comprises a set of one or more attenuation dips in the frequency response, wherein each attenuation dip is a local minima in the frequency response.

8. The test set of claim 7 further comprising:

a user input device coupled to the processor, the user input device configured to receive a signal indicating a frequency of an attenuation dip in the frequency response, wherein the processor is further configured to compute a length of the bridge tap based on the frequency of the attenuation dip.

* * * * *